(12) United States Patent
Tanikawa et al.

(10) Patent No.: US 7,286,410 B2
(45) Date of Patent: Oct. 23, 2007

(54) SEMICONDUCTOR INTEGRATED CIRCUIT

(75) Inventors: Hiroyuki Tanikawa, Akishima (JP);
Toshihiro Tanaka, Akiruno (JP);
Yutaka Shinagawa, Iruma (JP);
Takashi Yamaki, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 120 days.

(21) Appl. No.: 11/195,684

(22) Filed: Aug. 3, 2005

(65) Prior Publication Data

US 2006/0044871 A1    Mar. 2, 2006

(30) Foreign Application Priority Data

Aug. 30, 2004    (JP)    ............... 2004-250273

(51) Int. Cl.
*G11C 16/06*    (2006.01)
(52) U.S. Cl. .................... 365/185.22; 365/185.24; 365/185.29
(58) Field of Classification Search ........... 365/185.22, 365/185.24, 185.29
See application file for complete search history.

(56) References Cited

U.S. PATENT DOCUMENTS 6,519,184 B2 *    2/2003    Tanaka et al. ......... 365/185.22

| | | | |
|---|---|---|---|
| 2002/0059569 A1 | 5/2002 | Kondo | 717/170 |
| 2002/0116570 A1 | 8/2002 | Miyamoto | 711/103 |

FOREIGN PATENT DOCUMENTS

| | | |
|---|---|---|
| JP | 2001-306543 | 11/2001 |
| JP | 2002-245023 | 8/2002 |

* cited by examiner

*Primary Examiner*—David Lam
(74) *Attorney, Agent, or Firm*—Miles & Stockbridge PC

(57) ABSTRACT

A semiconductor integrated circuit has a first nonvolatile memory area and a second nonvolatile memory area to store information in accordance with a variable threshold voltage. At least one condition of the following conditions of the first nonvolatile memory area is made different from that of the second nonvolatile memory area: erase verify determination memory gate voltage, erase verify determination memory current, write verify determination memory gate voltage, write verify determination memory current, erase voltage, erase voltage application time, write voltage, and write voltage application time in the first nonvolatile memory area.

20 Claims, 20 Drawing Sheets

FIG. 4

| | CELL STRUCTURE | |
|---|---|---|

(a) Cell structure diagram with Vd, Vcg, Vmg, Vs terminals, labels 46, 42, 39, 38, 35, 44, Vsub, DRAIN, SOURCE.

| (b) | OPERATION VOLTAGE (V) | Vd | Vcg | Vmg | Vs | Vsub |
|---|---|---|---|---|---|---|
| | READ | 1.8 | 1.8 | 0 | 0 | 0 |
| | ERASE | 0 | 1.8 | 12 | 0 | 0 |
| | PROGRAM | 0 | 1.8 | 8 | 6 | 0 |

(c) HIERARCHICAL BIT LINE CONFIGURATION

HIGH VOLTAGE MOS

HIGH VOLTAGE MOS DRIVER

WORD DRIVER, CL, ML, 52, 51, 37, 36, BL, SL, 54, MEMORY, Z DRIVER, (ZMOS), 50, 53, GL

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| ERASE VERIFY DETERMINATION MEMORY GATE VOLTAGE | Vev1 | Vev2 | Vev1<Vev2 |

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| ERASE VERIFY DETERMINATION MEMORY CURRENT | Iev1 | Iev2 | Iev1>Iev2 |

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| WRITE VERIFY DETERMINATION MEMORY GATE VOLTAGE | Vpv1 | Vpv2 | Vpv1>Vpv2 |

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| WRITE VERIFY DETERMINATION MEMORY CURRENT | Ipv1 | Ipv2 | Ipv1<Ipv2 |

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| WRITE VERIFY DETERMINATION MEMORY GATE VOLTAGE | Vpv1 | Vpv2 | Vpv1>Vpv2 |
| ERASE VERIFY DETERMINATION MEMORY GATE VOLTAGE | Vev1 | Vev2 | Vev1<Vev2 |

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| ERASE VOLTAGE | Ve1 | Ve2 | \|Ve1\|>\|Ve2\| |
| ERASE VOLTAGE APPLICATION TIME | Pe1 | Pe2 | Pe1>Pe2 |

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY ARRAY 1 | MEMORY ARRAY 2 | CONDITION |
| WRITE VOLTAGE | Vp1 | Vp2 | |Vp1|>|Vp2| |
| WRITE VOLTAGE APPLICATION TIME | Pp1 | Pp2 | Pp1>Pp2 |

FIG. 31

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| MEMORY CELL DETERMINATION ITEM | MEMORY ARRAY 1 | MEMORY ARRAY 2 | CONDITION |
| MEMORY CELL GATE LENGTH | L1 | L2 | L1<L2 |
| MEMORY CELL GATE WIDTH | W1 | W2 | W1>W2 |

FIG. 32

| SPECIFICATIONS | PGM | DAT | PERFORMANCE |
|---|---|---|---|
| READ SPEED | S1 | S2 | S1>S2 |
| THE NUMBER OF REWRITE TIMES | X1 | X2 | X1<X2 |
| REWRITE CONDITION SETTING ITEM | MEMORY AREA 1 | MEMORY AREA 2 | CONDITION |
| ERASE VERIFY DETERMINATION MEMORY GATE VOLTAGE | Vev1 | Vev2 | Vev1≠Vev2 |
| ERASE VERIFY DETERMINATION MEMORY CURRENT | Iev1 | Iev2 | Iev1≠Iev2 |
| WRITE VERIFY DETERMINATION MEMORY GATE VOLTAGE | Vpv1 | Vpv2 | Vpv1≠Vpv2 |
| WRITE VERIFY DETERMINATION MEMORY CURRENT | Ipv1 | Ipv2 | Ipv1≠Ipv2 |
| ERASE VOLTAGE | Ve1 | Ve2 | Ve1≠Ve2 |
| ERASE VOLTAGE APPLICATION TIME | Pe1 | Pe2 | Pe1≠Pe2 |
| WRITE VOLTAGE | Vp1 | Vp2 | Vp1≠Vp2 |
| WRITE VOLTAGE APPLICATION TIME | Pp1 | Pp2 | Pp1≠Pp2 |
| MEMORY CELL SETTING ITEM | MEMORY ARRAY 1 | MEMORY ARRAY 2 | CONDITION |
| MEMORY CELL GATE LENGTH | L1 | L2 | L1≠L2 |
| MEMORY CELL GATE WIDTH | W1 | W2 | W1≠W2 |

SEMICONDUCTOR INTEGRATED CIRCUIT

CROSS-REFERENCE TO RELATED APPLICATION

The present application claims priority from Japanese patent application No. 2004-250273 filed on Aug. 30, 2004, the content of which is hereby incorporated by reference into this application.

BACKGROUND OF THE INVENTION

The present invention relates to a semiconductor integrated circuit having a nonvolatile memory in which characteristic degradation is caused by repetitive rewriting, and to a technique effective when applied to, for example, a microcomputer.

Japanese Unexamined Patent Publication No. 2001-306543 discloses a technique in which data such as a user program is written in a user memory area in a flash memory, default flash firmware, parameters, and flash identification information are pre-stored in a mask memory area in a mask ROM, version information, lot information, or the like is stored in a nonvolatile memory, and a CPU selects and executes the optimum flash firmware and parameters on the basis of the version information, thereby performing a process of rewriting the flash memory under optimum conditions.

Japanese Unexamined Patent Publication No. 2002-245023 discloses a technique in which an EEPROM for data and an EEPROM for program are provided, a lock code is stored in a designated area, and the possibility of falsification on money data and a program stored in a rewritable memory such as the EEPROM for data and the EEPROM for program is suppressed by using the lock code.

SUMMARY OF THE INVENTION

The inventors of the present invention have examined the assured number of rewriting times and reading speed of information stored in a rewritable nonvolatile memory typified by a flash memory. For example, for a flash memory formed on a chip in a microcomputer or the like, usually, the reading speed and the assured number of rewriting times are the same irrespective of a memory area. The inventors herein paid attention to the inconvenience of the technique.

To increase the speed of the reading operation, memory current has to be increased and, for this purpose, it is necessary to largely decrease the threshold voltage from a read determination level of a memory cell. It means widening of the threshold voltage difference (Vth window) between a threshold voltage in a write state and a threshold voltage in an erase state. As the threshold voltage difference increases, the larger stress is applied to a memory cell, and progress of characteristic degradation hastens. As a result, the rewriting cycle is shortened, and it becomes difficult to assure the large number of rewriting times such as 100,000 times. On the other hand, when the threshold voltage difference (Vth window) is reduced to lessen the stress of rewriting, the threshold voltage cannot be reduced so much from a memory cell read determination level. In short, deep erasure cannot be performed and a large memory current cannot be generated. When the memory current is small, it is difficult to realize reading at high speed such as 100 MHz. Since a flash memory provided in a microcomputer is requested to have read speed which is the same as execution speed of a program for use of storing the program, priority is given to high-speed reading, and the number of times of rewriting stored information cannot be assured. Such an on-chip flash memory cannot be applied to the use of data requiring the number of rewriting times such as 100,000 so that an external EEPROM or an external flash memory of a microcomputer has to be used.

Although the techniques described in the patent documents properly use a nonvolatile memory and a nonvolatile memory area in accordance with a use, attention has not been paid to division of the nonvolatile memory area from the viewpoint of reading speed and assurance of the number of rewriting times in accordance with a use. The inventors herein have found necessity to satisfy both of higher reading speed and assurance of the larger number of rewriting times in accordance with a use for a nonvolatile memory in a single semiconductor integrated circuit.

An object of the present invention is to provide a semiconductor integrated circuit capable of satisfying both of higher reading speed and assurance of the larger number of rewriting times in accordance with a use for a nonvolatile memory.

The above and other objects and novel features of the present invention will become apparent from the description of the specification and the appended drawings.

The outline of representative ones of the inventions disclosed in the application will be briefly described as follows.

[1] A semiconductor integrated circuit has a central processing unit and a rewritable nonvolatile memory area provided in an address space in the central processing unit. The nonvolatile memory area includes a first nonvolatile memory area and a second nonvolatile memory area for storing information in accordance with a threshold voltage which varies. In the first nonvolatile memory area, for example, a memory threshold voltage at the time of erasure is sufficiently low, and a memory threshold voltage at the time of writing is sufficiently high, so that relatively large memory current is assured, and high-speed reading can be performed. In the second nonvolatile memory area, for example, the memory threshold voltage at the time of erasing is controlled to be low to the extent low-speed reading can be performed and the memory threshold voltage at the time of writing is controlled to be high to the extent the S/N ratio does not decrease too much. Large stress of rewriting operation voltage is not applied to a memory cell. Consequently, progress of degradation with time of the memory characteristic can suppressed, and the assured number of rewriting times is increased. Whether the voltage reaches the target threshold voltage of the nonvolatile memory cell or not is determined by verification. The verification is performed on the basis of the voltage value and the current value. In the specification, erasure is equivalent to decrease in the threshold voltage of a nonvolatile memory cell, and writing is equivalent to increase in the threshold voltage of a nonvolatile memory cell.

To realize the threshold voltage difference, it is sufficient to make one or plural conditions out of erase verify determination memory gate voltage, erase verify determination memory current, write verify determination memory gate voltage, write verify determination memory current, erase voltage, erase voltage application time, write voltage, and write voltage application time in the first nonvolatile memory area different from that/those in the second nonvolatile memory area. Concretely, (i) the erase verify determination memory gate voltage in the first nonvolatile memory area is set to be lower than that in the second nonvolatile memory area, (ii) the erase verify determination current in the first nonvolatile memory area is set to be larger than that in the second nonvolatile memory area, (iii) the write verify determination memory gate voltage in the first nonvolatile memory area is set to be higher than that in the second nonvolatile memory area, (iv) the write verify determination memory current in the first nonvolatile memory area is set to be smaller than that in the second nonvolatile memory area, (v) the write verify determination memory gate voltage in the first nonvolatile memory area is set to be higher than that in the second nonvolatile memory area and the erase verify determination memory gate voltage in the first nonvolatile memory area is set to be lower than that in the second nonvolatile memory area, (vi) the erase voltage in the first nonvolatile memory area is set to be higher than that in the second nonvolatile memory area, (vii) the erase voltage application time in the first nonvolatile memory area is set to be longer than that in the second nonvolatile memory area, (viii) the write voltage in the first nonvolatile memory area is set to be higher than that in the second nonvolatile memory area, and (ix) the write voltage application time in the first nonvolatile memory area is set to be longer than that in the second nonvolatile memory area.

[2] In the above-described means, attention is paid to the difference in the erase/write conditions. From another viewpoint of the invention, attention is paid to the difference in nonvolatile memory cell structures. Specifically, a semiconductor integrated circuit includes a central processing unit and a rewritable nonvolatile memory area provided in an address space in the central processing unit. The nonvolatile memory area includes a first nonvolatile memory area and a second nonvolatile memory area for storing information in accordance with a threshold voltage which varies. Memory cell gate length and/or memory cell gate width in the first nonvolatile memory area are/is different from those/that in the second nonvolatile memory area, speed of reading information stored in the first nonvolatile memory area is higher than that of reading information stored in the second nonvolatile memory area, and the assured number of rewriting times in the second nonvolatile memory area is larger than that in the first nonvolatile memory area. Concretely, when the memory cell gate length in the first nonvolatile memory area is different from that in the second nonvolatile memory area, the memory cell gate length in the first nonvolatile memory area is set to be shorter than that in the second nonvolatile memory area. When memory cell gate width in the first nonvolatile memory area is different from that in the second nonvolatile memory area, the memory cell gate width in the first nonvolatile memory area is set to be larger than that in the second nonvolatile memory area. The shorter the memory cell gate length is, the larger the conductance of the memory cell transistor is and it can contribute to increase the reading speed. It is also possible to employ both of the difference in the erase/write condition and the difference in structure such as the gate length of the nonvolatile memory cell.

[3] The invention also provides a data processing method of rewriting a first nonvolatile memory area and a second nonvolatile memory area for storing information in accordance with a threshold voltage which varies in a data processing system having the first and second nonvolatile memory areas and a central processing unit capable of accessing the first and second memory areas. The method includes the steps of: making one or plural conditions out of erase verify determination memory gate voltage, erase verify determination memory current, write verify determination memory gate voltage, write verify determination memory current, erase voltage, erase voltage application time, write voltage, and write voltage application time different between the first nonvolatile memory area and the second nonvolatile memory area; setting speed of reading information stored in the first nonvolatile memory area to be higher than that of reading information stored in the second nonvolatile memory area; and setting the assured number of rewriting times in the second nonvolatile memory area to be larger than that in the first nonvolatile memory area.

An effect obtained by the representative ones of the inventions disclosed in the application is briefly described as follows.

The invention can satisfy both of higher reading speed and assurance of the larger number of rewriting times for a nonvolatile memory.

BRIEF DESCRIPTION OF DRAWINGS

FIG. 4 is an explanatory diagram representatively showing characteristics of the nonvolatile memory cell of FIG. 3.

FIG. 31 is diagram showing the superiority/inferiority of the characteristics according to the difference in the memory cell gate lengths and the memory cell gate widths.

FIG. 32 is a diagram showing the summary of performances according to the difference in the rewriting conditions and the difference in the device structural conditions of the memory cell with respect to the uses in the data area and the program area.

DETAILED DESCRIPTION OF THE PREFERRED EMBODIMENTS OF THE INVENTION

Microcomputer

Figure 1:
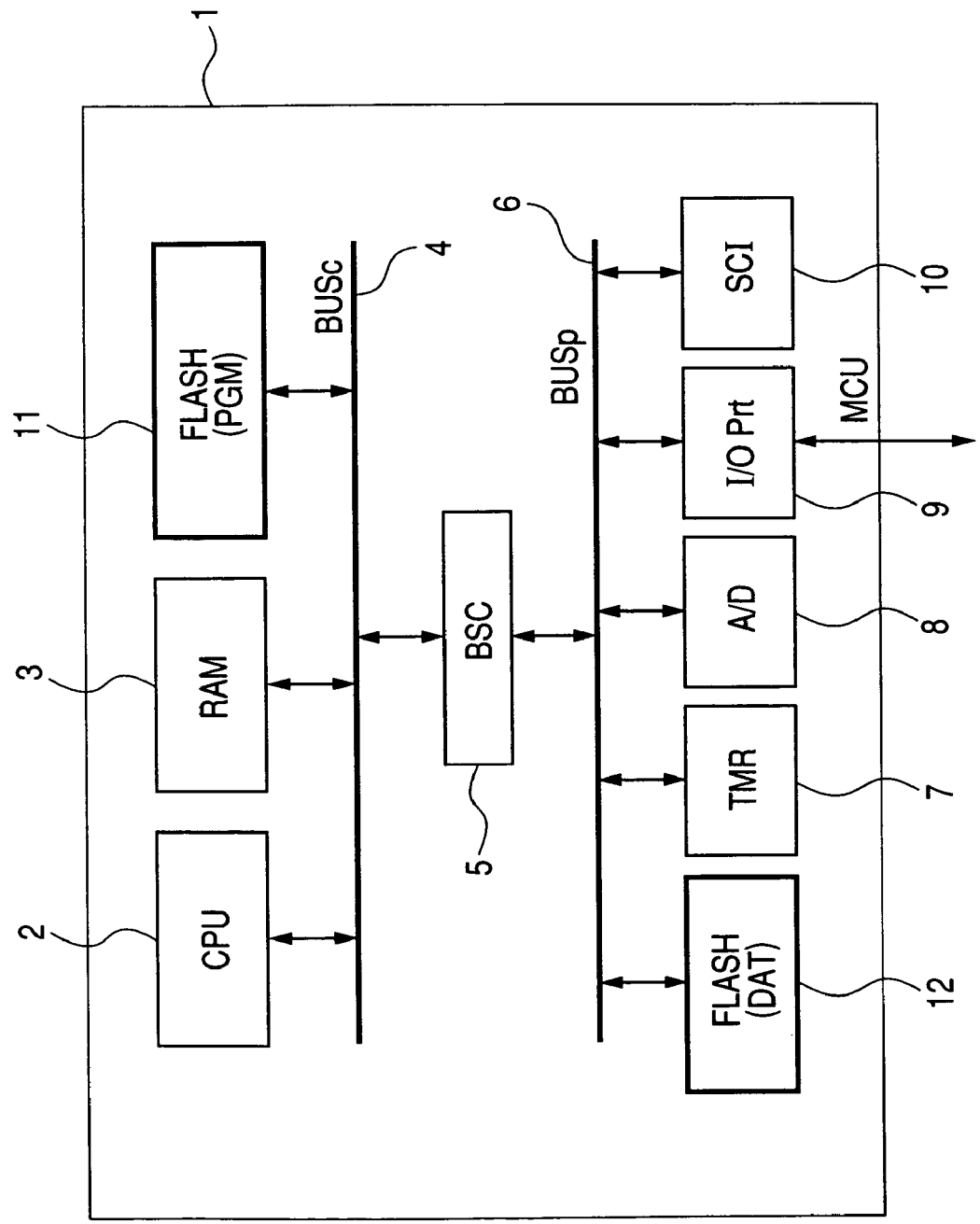
FIG. 1 is a block diagram of a microcomputer according to an embodiment of the present invention.

FIG. 1 illustrates a microcomputer. A microcomputer (MCU) 1 is formed on a single semiconductor substrate made of single crystal silicon or the like by, for example, the CMOS integrated circuit manufacturing technique. The microcomputer 1 includes a central processing unit (CPU) 2, a random access memory (RAM) 3 as a volatile memory used as a work area of the CPU 2 or the like, a CPU bus (BUSc) 4 as a first bus to which the CPU 2, the RAM 3, and the like are connected, a bus controller (BSC) 5 connected to the CPU bus 4, and a peripheral bus (BUSP) 6 as a second bus connected to the bus controller 5, and has a hierarchical bus configuration. To the peripheral bus 6, peripheral circuits such as a timer (TMR) 7, an analog/digital (A/D) converter 8, an input/output port (I/O prt) 9, and a serial interface controller (SCI) 10 are connected. To the CPU bus 4, a flash memory 11 as an electrically-rewritable first nonvolatile memory for storing information according to a threshold voltage which varies is connected. To the peripheral bus 6, a flash memory 12 as an electrically-rewritable second nonvolatile memory for storing information according to a threshold voltage which varies is connected. The flash memory 11 has, as a first nonvolatile memory area, an area (program area PGM) for storing a program to be executed by the CPU 2. The flash memory 12 has, as a second nonvolatile memory area, an area (data area DAT) used when the CPU 2 executes a program.

In the hierarchical bus structure, since circuit modules for determining data processing ability such as the CPU 2 and the RAM 3 are connected to the CPU bus 4, the CPU bus 4 takes the form of a high-speed bus in which a wiring load and the like is regulated and intends to perform high-speed data transfer. The many peripheral circuit modules such as the timer 7 and the A/D converter 8 connected to the peripheral bus 6 are operated by the CPU 2 which sets parameters and the like. External memories such as an EEPROM for temporarily holding data are connected via the I/O port 9 connected to the peripheral bus 6. Therefore, the peripheral bus 6 may be a relatively low-speed bus.

In the bus hierarchical structure, the flash memory 11 having the program area PGM is connected to the CPU bus 4 and can be read at the execution speed of the CPU 2. On the other hand, the flash memory 12 having the data area DAT is connected to the peripheral bus 6. It is sufficient that the flash memory 12 is read at relatively low speed like the other peripheral modules. It is, however, expected that the flash memory 12 is rewritten more frequently as compared with the program area PGM. The data area DAT rewritten frequently is used for storing data such as parameter information which is not directly related to execution of a program, so that the necessary to read information in the data area DAT at high speed is low.

The microcomputer 1 is formed in consideration of the circumstances, and the nonvolatile memory area on the chip is divided in the program area PGM from which data can be read at high speed and the data area DAT subjected to a large number of rewriting operations.

Flash Memory

Figure 2:
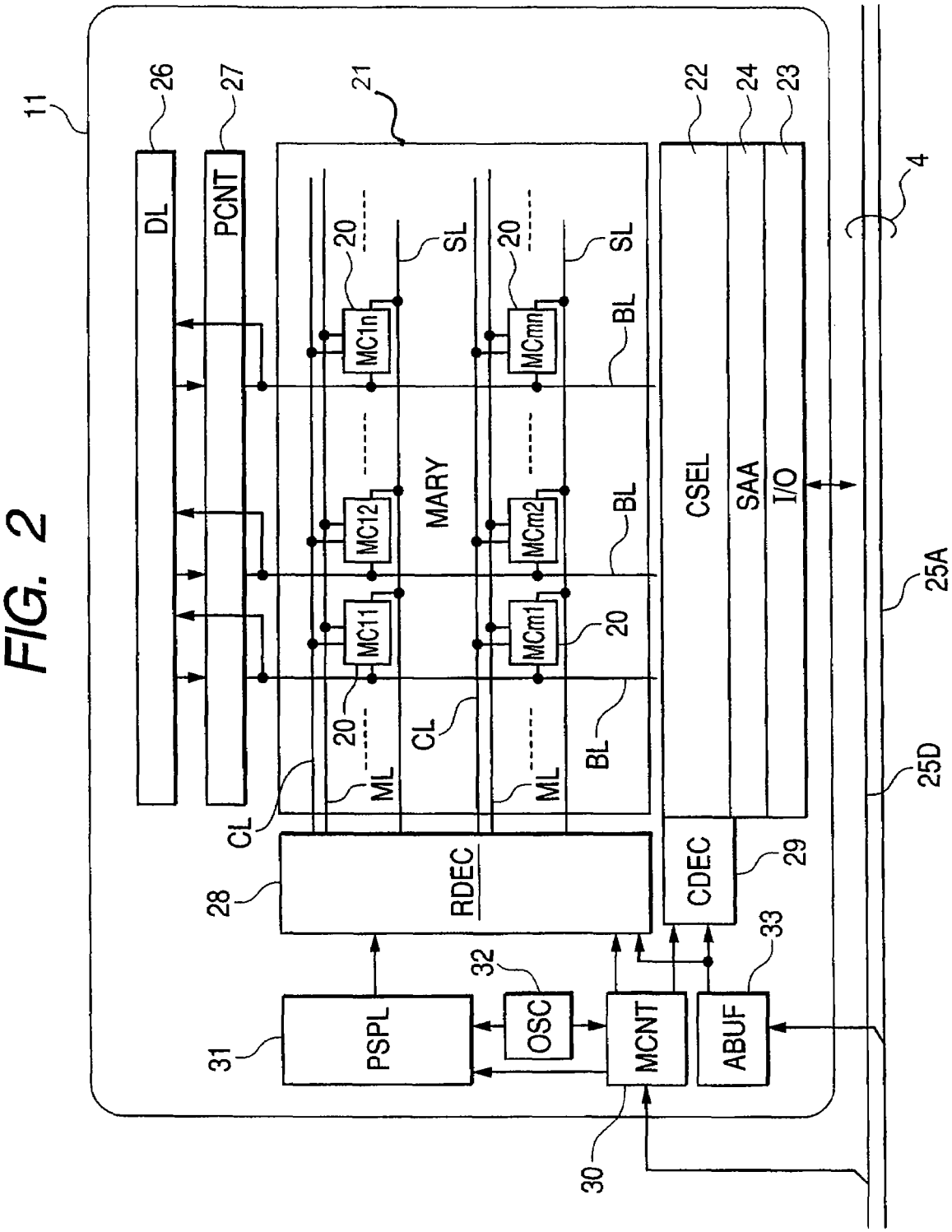
FIG. 2 is a block diagram illustrating the configuration of a flash memory.

FIG. 2 shows the configuration of the flash memory 11. The flash memory 11 has a memory array (MARY) 21 in which a number of electrically erasable and programmable nonvolatile memory cells (MC11 to MCmn) 20 are arranged in a matrix. Although not limited, the nonvolatile memory cell 20 has a split gate structure and has a source, a drain, a channel, and a selection gate (control gate) and a memory gate which are adjacent to each other on the channel and are insulated from each other. The source is connected to a source line SL of a corresponding row, the drain is connected to a bit line BL of a corresponding column, the selection gate is connected to a control gate control line (word line) CL of a corresponding row, and the memory gate is connected to a memory gate control line ML of a corresponding row. Alternately, the nonvolatile memory cell 20 may employ a stacked gate structure in which a source (connected to a source line), a drain (connected to a bit line), a channel, and a floating gate and a control gate (connected to a word line) stacked on the channel so as to be insulated from each other.

The bit line BL selected by a column selection circuit (CSEL) 22 is connected to an input/output (I/O) circuit 23. In reading operation or verifying operation, information stored in the memory cell 20 which is read by the bit line BL is amplified by a corresponding sense amplifier in a sense amplifier array (SAA) 24, and the resultant is output from the input/output circuit 23 to a data bus 25D. A data latch (DL) 26 connected to the bit line BL holds write data. The write data is sequentially input from the input/output circuit 23 via the column selection circuit 22. An output of the data latch 26 is supplied to a write control circuit (PCNT) 27. The write control circuit 27 controls application of a write voltage to the bit line BL in accordance with the write data.

The control gate control lines CL of the nonvolatile memory cells 20 are selectively driven in accordance with a result of decoding an address signal in a row decoder (RDEC) 28. The drive level is determined in accordance with erasing, writing, or reading process on the flash memory 11. Selection of a bit line BL by the column selection circuit 22 is performed according to the result of decoding the address signal by a column decoder (CDEC) 29. The address signal is supplied from an address buffer (ABUF) 33. The address buffer 33 is connected to an address bus 25A.

Control information is set for a control circuit (MCNT) 30 via the data bus 25D from the CPU 2 and, according to the control information, the control circuit 30 performs a control sequence and a control for switching an operation power source according to the reading, erasing, or writing operation. Various operation power sources are generated by an internal power source circuit (PSPL) 31. An oscillation circuit (OSC) 32 generates a booster clock for a booster of the internal power source circuit 31 and a sync clock for the control circuit 30.

Nonvolatile Memory Cell

Figure 3:
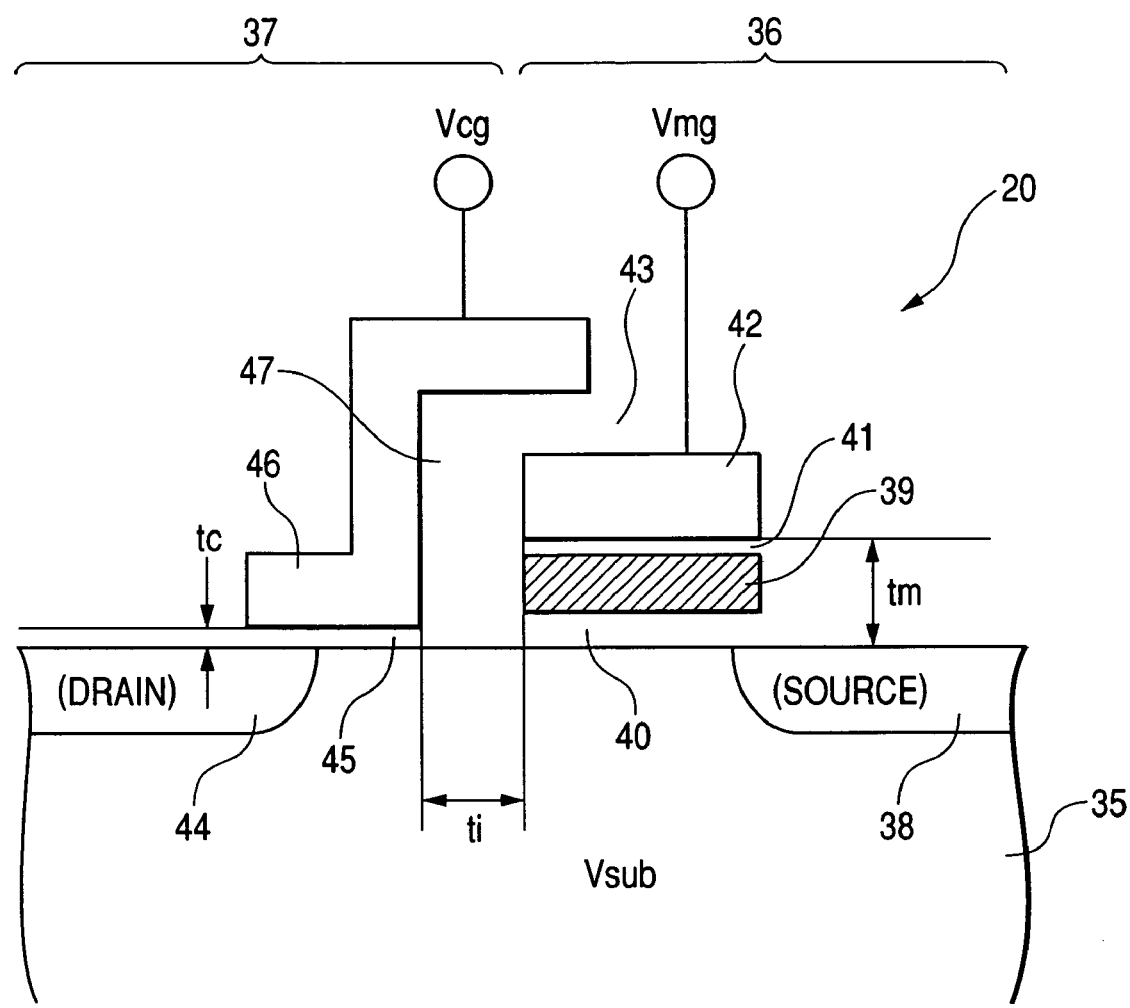
FIG. 3 is a cross section illustrating a device structure of a nonvolatile memory cell.

FIG. 3 shows a device structure of the nonvolatile memory cell 20. The nonvolatile memory cell 20 has a MOS type first transistor 36 used for storing information and a MOS type second transistor 37 (select MOS transistor) for selecting the first transistor 36 in a p-type well region 35 provided for a silicon substrate. The first transistor 36 has an n-type diffusion layer (n-type impurity region) 38 to become a source line electrode connected to a source line, a charge accumulation region (for example, silicon nitride film) 39, insulating films (for example, silicon oxide films) 40 and 41 provided on and under the charge accumulation region 39, a memory gate electrode (for example, n-type polysilicon layer) 42 for applying a high voltage at the time of writing/erasing, and an oxide film (for example, silicon oxide film) 43 for protecting the memory gate electrode. The second transistor 37 has an n-type diffusion layer (n-type impurity region) 44 to become a bit line electrode connected to a bit line, a gate insulating film (for example, silicon oxide film) 45, a control gate electrode (for example, an n-type polysilicon layer) 46, and an insulating film (for example, silicon oxide film) 47 for insulating between the control gate electrode 46 and the memory gate electrode 42.

When the sum of thicknesses of the charge accumulation region 39 of the first transistor 36 and the insulating films 40 and 41 provided on and under the charge accumulation region 39 (which will be called the memory gate insulating films 39, 40, and 41) is tm, the thickness of the gate insulating film 45 of the control gate electrode 46 is tc, and the thickness of the insulating film between the control gate 46 and the charge accumulation region 39 is ti, the relation of tc<tm ≦ti is realized. Because of the dimensional difference between the gate insulating film 45 and the memory gate insulating films 39, 40, and 41, the gate withstand voltage of the second transistor 37 is lower than that of the first transistor 36.

The word "drain" written in the portion of the diffusion layer 44 denotes that the diffusion layer 44 functions as a drain electrode of the transistor in data reading operation, and the word "source" written in the portion of the diffusion layer 38 denotes that the diffusion layer 38 functions as a source electrode of the transistor. In the erasing/writing operation, the functions of the drain and source electrodes may be interchanged irrespective of the indication of drain and source.

At the time of injecting hot electrons into the charge accumulation region 39, the source side of the channel of the memory transistor 36 to which high voltage is supplied from the drain side, and the drain side of the channel of the select transistor 37 do not enter a conductive state of electrically low resistance for the reason that the source and drain sides do not share a low-resistance region such as the diffusion region. Consequently, high voltage on the memory transistor 36 side is not applied to the select transistor 37. Therefore, even when the gate insulating film of the select transistor 37 is formed thinner than the gate insulating film of the memory transistor 36, the gate oxide film of the select transistor is not destroyed in the rewriting operation. It improves conductance of the select transistor by the thin gate oxide film, and assures to increase the reading speed.

FIG. 4 representatively shows features of the nonvolatile memory cell of FIG. 3. FIG. 4 illustrates a connection form of the nonvolatile memory cell 20 in the hierarchical bit line structure. The diffusion layer 44 is connected to the bit line BL, the diffusion layer 38 is connected to the source line SL, the memory gate electrode 42 is connected to the memory gate control line ML, and the control gate electrode 46 is connected to the control gate control line CL. The bit line BL is connected to a global bit line GL via an n-channel type switch MOS transistor (ZMOS) 50. Although not shown, plural nonvolatile memory cells 20 are connected to the bit line BL, and plural bit lines BL are connected to one global bit line GL via the ZMOS 50.

Representatively shown in FIG. 4 are a first driver (word driver) 51 for driving the control gate control line CL, a second driver 52 for driving the memory gate control line ML, a third driver (Z driver) 53 for switching the ZMOS 50, and a fourth driver 54 for driving the source line SL. The drivers 52 and 54 are constructed by high voltage MOS drivers using MOS transistors whose gate withstand voltage is high. The drivers 51 and 53 are constructed by drivers using MOS transistors whose gate withstand voltage is relatively low.

In writing operation of setting a relatively high threshold voltage in the first transistor 36 of the nonvolatile memory cell 1, for example, a memory gate voltage Vmg and a source line voltage Vs are set as high voltages, a control gate voltage Vcg is set to 1.8V, a write select bit line is set to 0V (ground potential of the circuit), and a write non-select bit line is set to 1.8V. The second transistor 37 of the write select bit line is turned on to pass current from the diffusion layer 38 to the diffusion layer 44. Hot electrons generated around the charge accumulation region 39 on the control gate electrode 46 side by the current may be held in the charge accumulation region 39. In the case of setting the write current by constant current, the write select bit line potential is not limited to the ground potential. For example, it is sufficient to apply about 0.5V to pass channel current. In the writing operation, in the n-channel type memory cell, the diffusion layer 38 functions as a drain, and the diffusion layer 44 functions as a source. The writing form is injection of hot electrons to the source side.

In erasing operation of setting a relatively low threshold voltage in the first transistor 36, for example, a high voltage is applied to the memory gate voltage Vmg, the second transistor 37 is turned on, the diffusion layers 44 and 38 are set to the ground potential of the circuit, and the electrons held in the charge accumulation region 39 are discharged to the memory gate electrode 42. Alternately, the erasing operation can be also performed by turning off the second transistor 37, or by turning off the second transistor 37 and making the source line SL floated.

As obviously understood from the writing/erasing operations on the first transistor 36, the operations can be realized without applying a high voltage to the control gate control line CL and the bit line BL. It assures that the gate withstand voltage of the second transistor 37 may be relatively low. It does not require that the ZMOS 50 has high withstand voltage.

Although not limited, the first transistor 36 in the erase state in which the threshold voltage is set to low is of the depletion type, and the first transistor 36 in the write state in which the threshold voltage is set to high is of the enhancement type.

In reading operation on the nonvolatile memory cell 20 in FIG. 4, it is sufficient to set the source line voltage Vs and the memory gate voltage Vmg to 0V and set the control gate voltage Vcg of a memory cell to be selected for reading to a selection level of 1.8V. Depending on whether current flows or not according to a threshold voltage state of the first transistor 36 when the second transistor 37 is turned on, stored information is read and transmitted onto the bit line BL. Since the second transistor 37 has a gate oxide film thickness smaller than that of the first transistor 36 and has a small gate withstand voltage, the conductance of the whole nonvolatile memory cell 20 can be made relatively high as compared with that in the case where both of a MOS transistor for storage and a MOS transistor for selection are formed to have high withstand voltage. Thus, data reading speed can be increased.

Although not shown, the flash memory 12 can also employ the configurations of FIGS. 2 to 4.

Optimization of Rewrite Conditions

The rewrite conditions of a nonvolatile memory cell are optimized so that memory current sufficient to perform high-speed reading can be assured in the program area PGM in the flash memory 11 and voltage stress can be lessened in the data area DAT in each of other flash memories 12 (so that a large number of rewriting times can be assured). As a method of the optimization, one or more conditions out of erase verify determination memory gate voltage, erase verify determination memory current, write verify determination memory gate voltage, write verify determination memory current, erase voltage, erase voltage application time, write voltage, and write voltage application time is/are made different between the program area PGM and the data area DAT. By the difference, the program area PGM in the flash memory 11 is made superior to the data area DAT in the flash memory 12 with respect to reading speed performance, and the data area DAT in the flash memory 12 is made superior to the program area PGM in the flash memory 11 with respect to the assured number of rewriting times.

For example, the state where the memory threshold voltage is low is set to an erase state, and the state where the memory threshold voltage is high is set to a write state. The larger the difference between the read voltage and the memory threshold voltage in the erase state is, the larger the memory current at the time of reading is. At the time of erasing, a determination level is set, and erase voltage is applied while determining that the memory threshold voltage becomes equal to or lower than the determination level so that sufficient memory current can be assured at the time of reading. The determining operation will be called "erase verification", and the determination level can be defined by a voltage applied to the memory gate and the value of memory current flowing at the time. On the other hand, the larger the difference between the read voltage and the memory threshold voltage in the write state is, the smaller the memory current at the time of reading becomes, and the difference from the erase state becomes clearer. At the time of writing, a reference level is set, and a write voltage is applied while determining so that the memory threshold voltage is always equal to or higher than the reference level. The determining operation will be called "write verification". The determination level can be defined by a voltage applied to the memory gate and the value of memory current passed at the time like the erase verify.

The rewriting conditions are optimized by using erase control and write control on the flash memories 11 and 12. Before describing each of the optimizing conditions, the erase and write control flows will be described.

Figure 5:
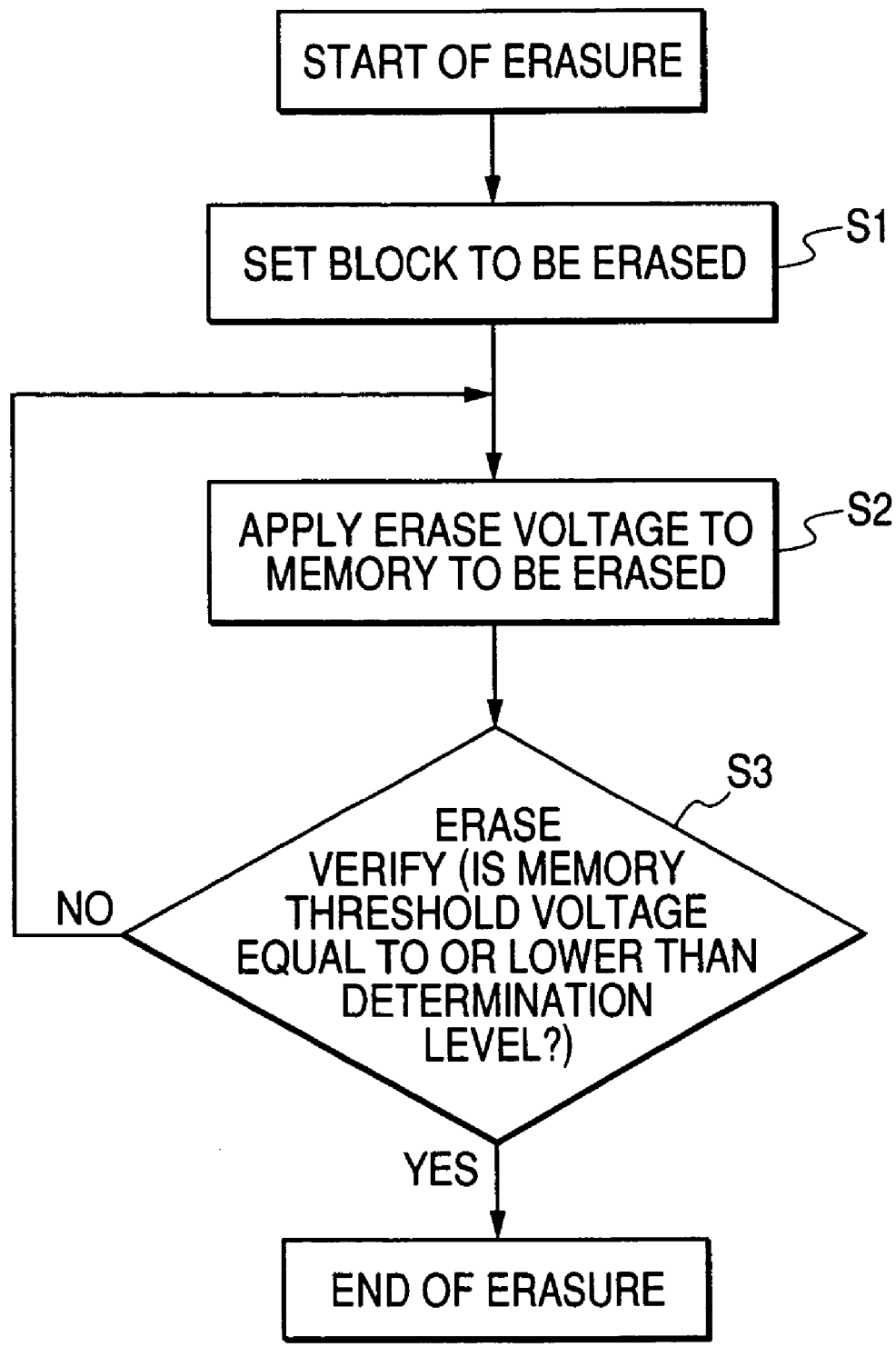
FIG. 5 is a flowchart showing the flow of erasing the flash memory.

FIG. 5 illustrates a flash memory erasing flow. When start of erasure is instructed, the CPU 2 sets a block to be erased (S1) and applies an erase voltage to the set block to be erased only for predetermined time (S2). Subsequently, the CPU 2 performs the erase verification on a nonvolatile memory cell to be erased and determines whether the threshold voltage becomes equal to or lower than the erase determination level or not (S3). If NO, the CPU 2 further applies the erase voltage (S2), repeats steps S2 and S3 until the threshold voltage becomes equal to or lower than the erase determination level and, when the threshold voltage becomes the erase determination level or less, finishes the erasing operation. The erase condition of the erase verification memory gate voltage or erase verification memory current is the determination condition in the determining process of step S3. The erase conditions of the erase voltage or the erase voltage application time are the conditions of the voltage applying process of step S2. For example, by making the erase verify determination memory gate voltage in the program area PGM and that in the data area DAT different from each other, a threshold voltage distribution in the program area PGM and that in the data area DAT which are different from each other can be generated. Since the erase voltage to be applied, pulse width specifying the erase voltage application time, and the like are also parameters exerting an influence on the characteristic degradation, the threshold voltage may be controlled by uniquely setting optimum values in the areas.

Figure 6:
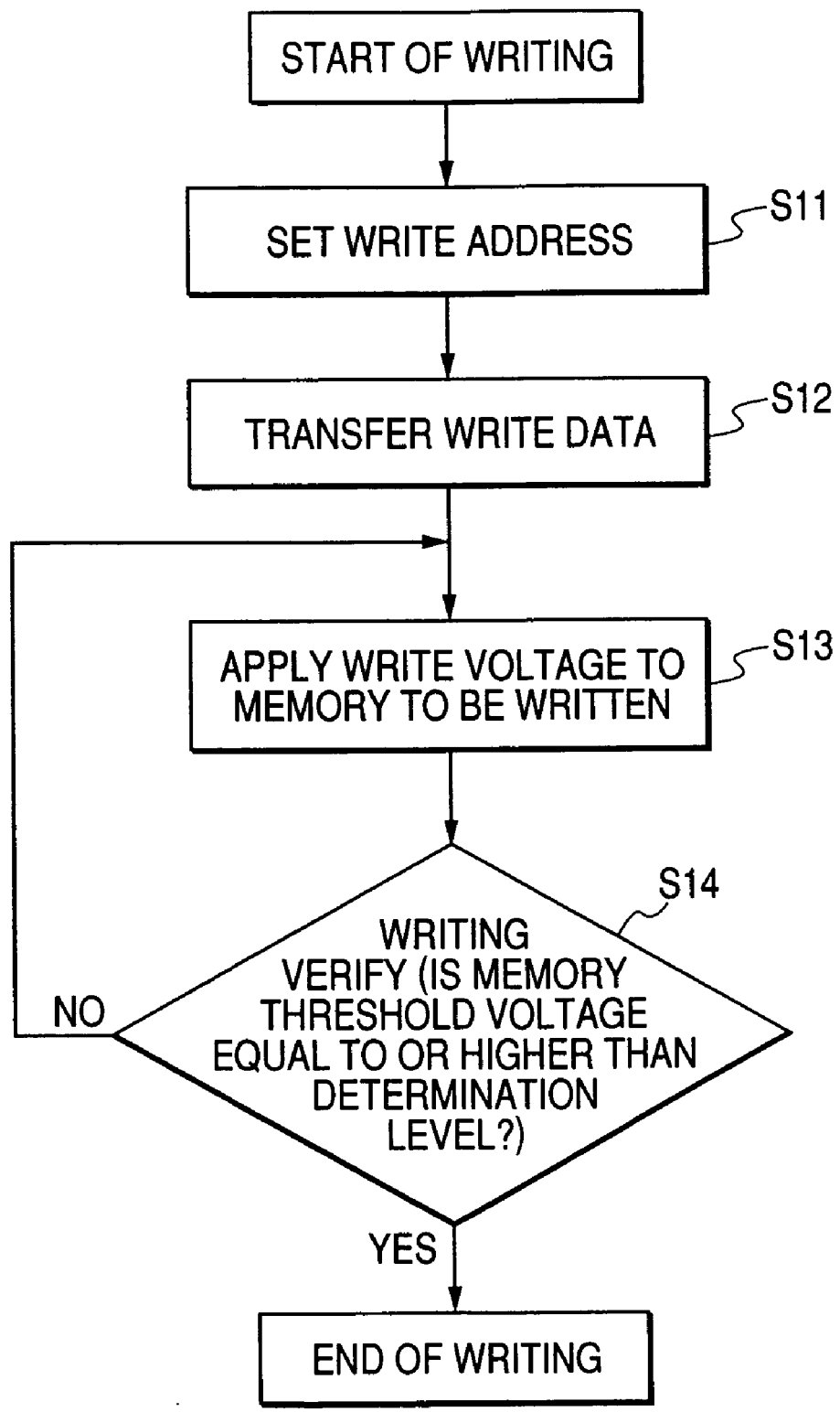
FIG. 6 is a flowchart showing the flow of writing the flash memory.

FIG. 6 shows a flow of writing information to the flash memory. When the writing operation starts, the CPU 2 outputs a write address to a bus (S11), internally transfers write data to a flash memory to be written (S12) and applies a write voltage to the memory to be written in accordance with the address (S13). Subsequently, the CPU 2 performs the write verification on a nonvolatile memory cell to be written and determines whether the threshold voltage becomes equal to or higher than the write determination level (S14). If NO, the CPU 2 further applies the write voltage (S13), repeats steps S13 and S14 until the threshold voltage becomes equal to or higher than the write determination level and, when the threshold voltage becomes the write determination level or less, finishes the writing operation. It is sufficient to perform a control of uniquely setting optimum values in both of the program area PGM and the data area DAT with respect to the write verify determination level, write voltage, and the pulse width specifying write voltage application time.

Difference in Erase Verify Determination Memory Gate Voltage Conditions

Figures 7, 8:
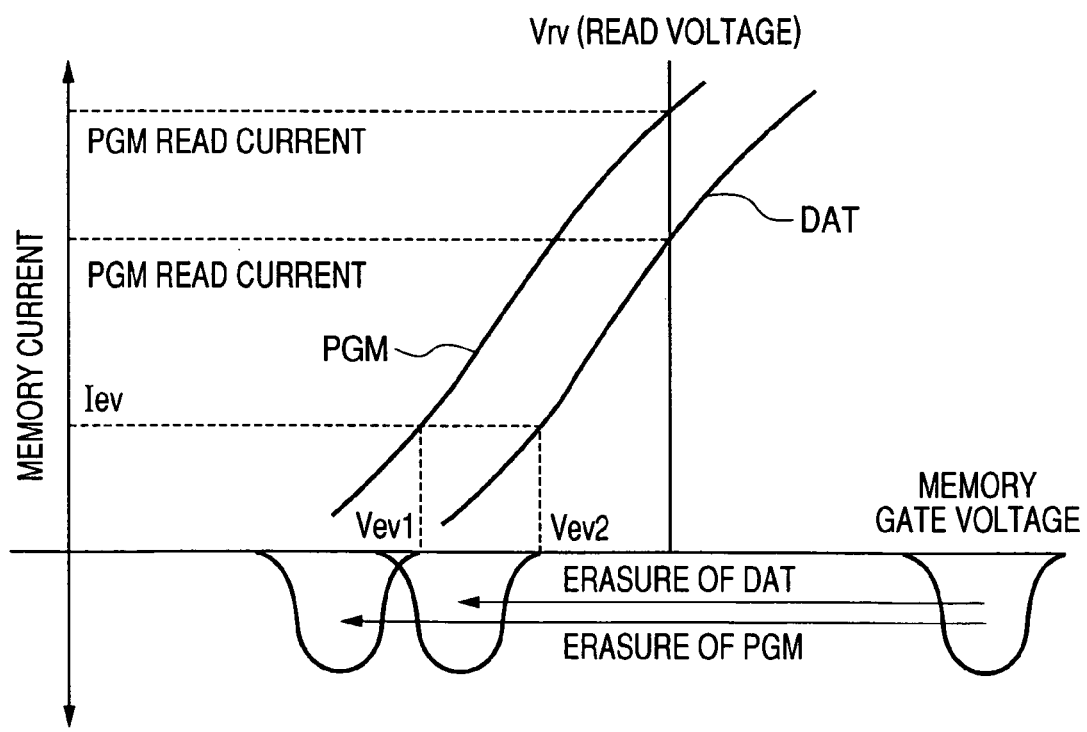
FIG. 7 is a diagram showing performances when erase verify determination memory gate voltage conditions in a program area PGM and those in a data area DAT are different from each other.
FIG. 8 is a characteristic diagram illustrating the relation between a threshold voltage amount and memory current when the erase verify determination memory gate voltage in the program area PGM is set to be lower than the erase verify determination memory gate voltage in the data area DAT.
Figure 9:
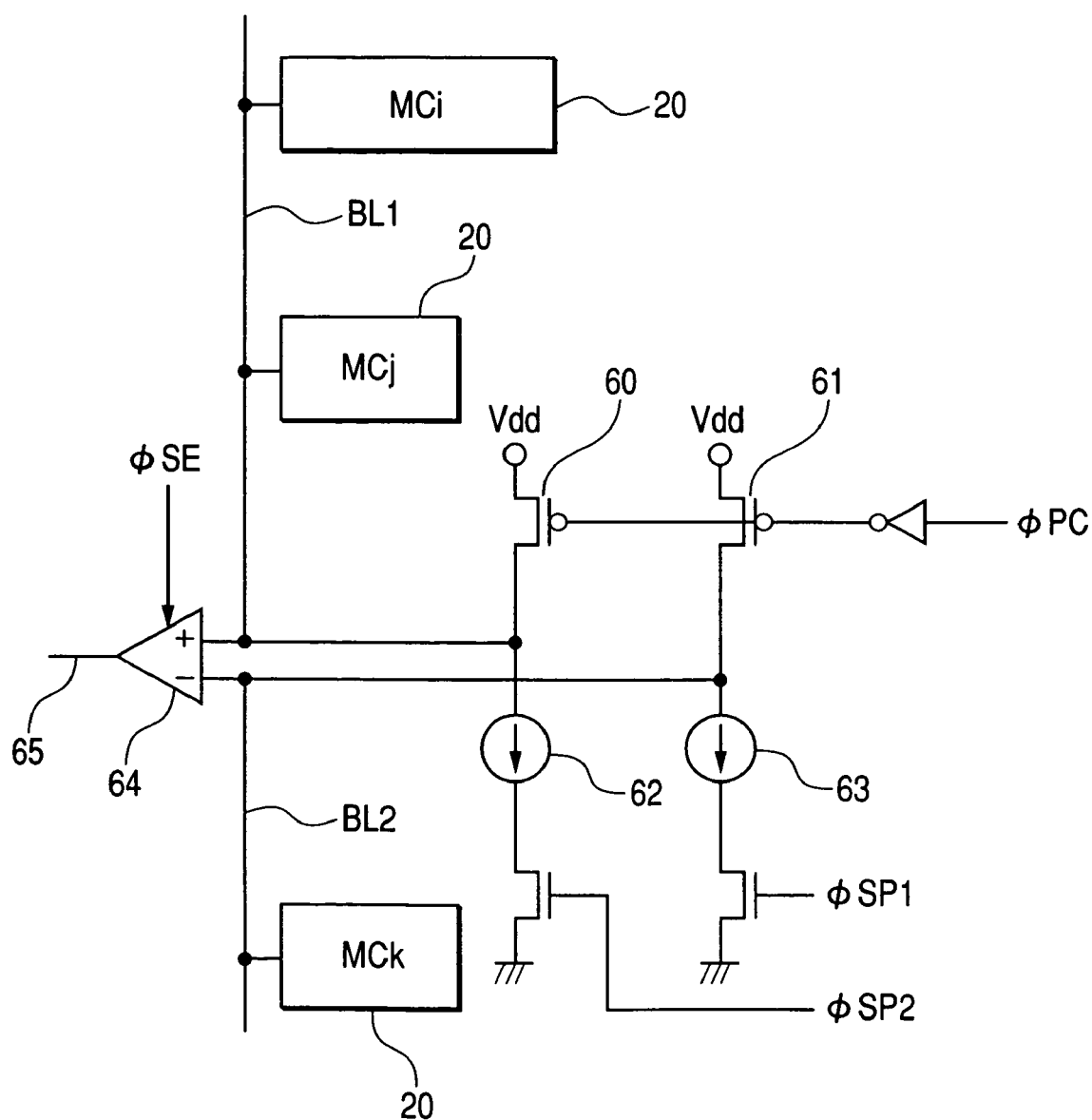
FIG. 9 is a circuit diagram illustrating circuits of a read system.
Figure 10:
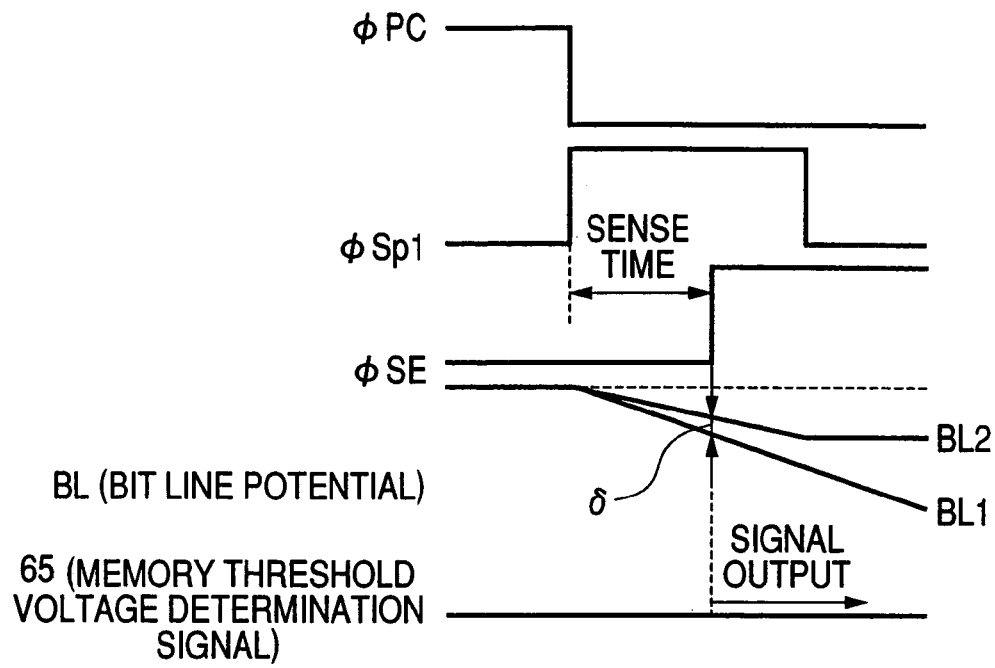
FIG. 10 is a waveform chart illustrating the waveforms of read signals to a memory cell in the erase state in the program area PGM.
Figure 11:
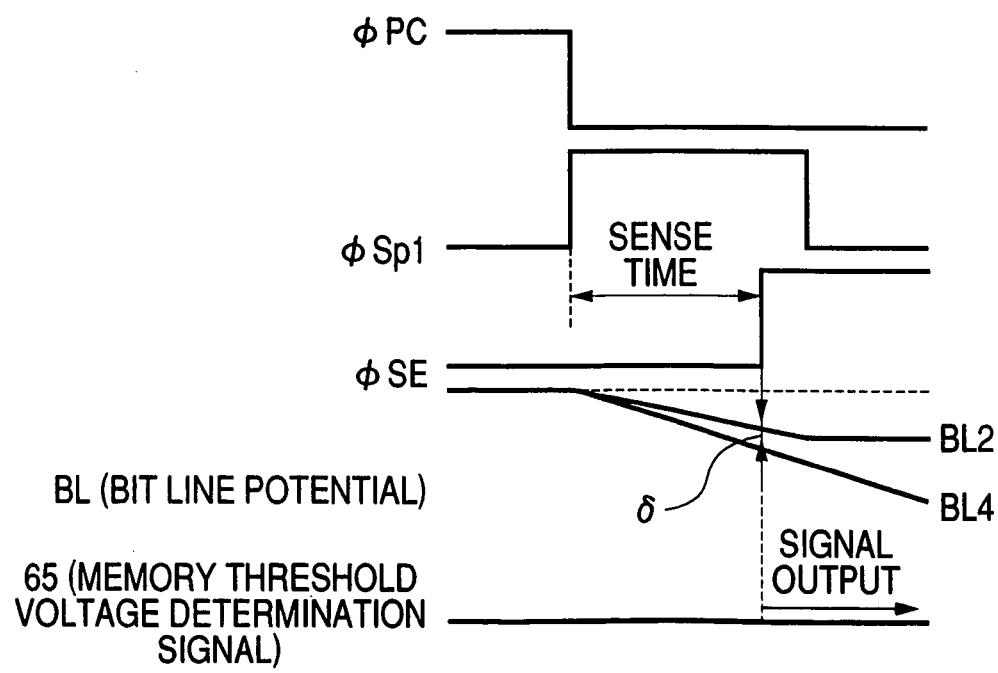
FIG. 11 is a waveform chart illustrating the waveforms of read signals to a memory cell in the erase state in the data area DAT.

As a first example of optimization of the rewrite condition, the case of making the erase verify determination memory gate voltage condition vary will be described. In the erase verification process S3, an erase verification determine memory gate voltage lower than that in the data area DAT is applied to the program area PGM. It is sufficient to vary the erase verify determination memory gate voltage in accordance with the target to be erased which is either the flash memory 11 or 12. As shown in FIG. 7, when the erase verify determination memory gate voltage in the program area PGM is set to Vev1 and that in the data area DAT is set to Vev2, the relation of Vev1<Vev2 is satisfied. FIG. 8 shows the relation between the threshold voltage amount and the memory current at that time. When a read voltage Vrv is applied to the memory gate of the nonvolatile memory cell 20, read current flowing in the memory cell in the erase state in the program area PGM is larger than that in the data area DAT. In FIG. 7, when the reading speed in the program area PGM is S1 and that in the data area DAT is S2, the relation of S1>S2 is satisfied. FIG. 9 shows an example of a read circuit. The load on a bit line BL1 and that on a bit line BL2 are set to be equal to each other. Before start of the reading operation, both of the bit lines BL1 and BL2 are pre-charged via charge MOS transistors 60 and 61. Constant current circuits 62 and 63 generate current which is about the half of the memory current in the erase state. When a memory cell (MCi) 20 on the bit line BL1 side is to be read, selection voltage is applied to the control gate and the memory gate of the target memory cell (MCi) 20, and the constant current circuit 63 on the bit line BL2 side is activated by a sense period control signal bit SP1. In short, the bit line BL1 side is set as a sense side, and the bit line BL2 side is set as a reference side. A sense amplifier 64 is started at a timing a bit line potential difference equal to or larger than the minimum detection signal amount of the sense amplifier 64 to determine a memory threshold voltage determination signal 65. SE denotes an activate control signal of the sense amplifier 64, and PC denotes a precharge control signal. FIG. 10 shows read signal waveforms for the memory cell in the erase state in the program area PGM. FIG. 11 shows read signal waveforms for the memory cell in the erase state in the data area DAT. Sense time Tsp denotes a period since the pre-charging is stopped and the constant current circuit 63 is activated until the sense amplifier 64 is started. Since the threshold voltage of the memory cell 20 in the erase state in the program area PGM is set to be lower than that in the data area DAT, the sense time Tsp in the program area PGM is shorter than that in the data area DAT. Therefore, the data reading speed in the program area PGM can be made higher than that in the data area DAT.

Figure 12:
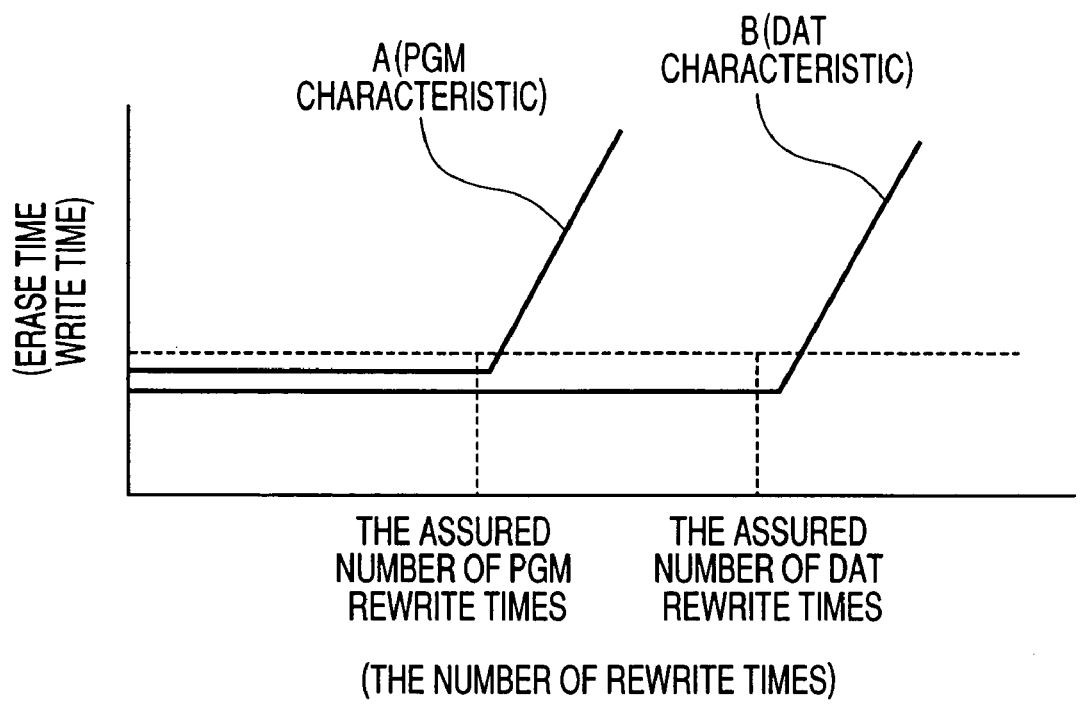
FIG. 12 is a characteristic diagram showing the relation between a memory threshold voltage change and the number of rewriting times at the time of erasure/writing.

FIG. 12 shows the relation between a memory threshold voltage change at the time of erasure/writing and the number of rewriting times. A characteristic "A" is a characteristic of the program area PGM in which the memory threshold voltage change at the time of rewriting is large, and a characteristic "B" is a characteristic of the data area DAT in which a memory threshold voltage change at the time of rewriting is small. If the number of rewriting times when the time required for erasure/writing starts increasing is regarded as the assured number of rewriting times, the assured number of rewriting times of the program area PGM is smaller than that in the data area DAT. When a change in the memory threshold voltage at the time of erasure/writing is large, large voltage stress occurs. Consequently, degradation in the characteristics hastens more than the case where the memory threshold voltage change is small.

Figure 13:
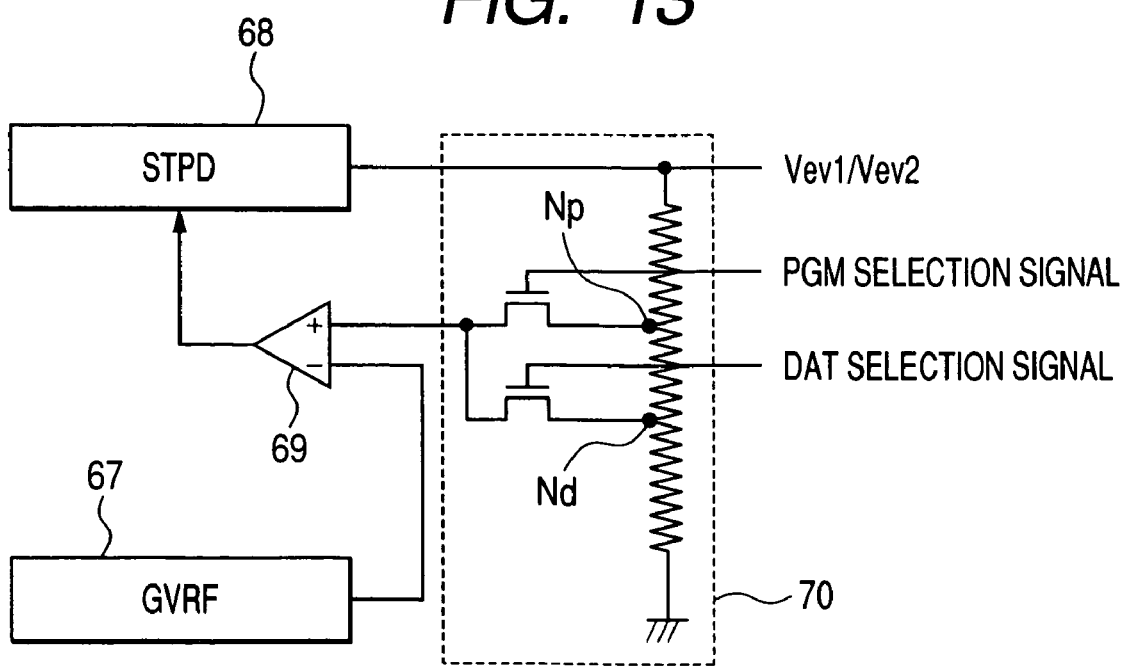
FIG. 13 is a circuit diagram of a circuit for generating the erase verify determination memory gate voltage.

FIG. 13 shows a circuit for generating the erase verify determination memory gate voltage. The operation of a voltage decreasing circuit (STPD) 68 such as a charge pump circuit is negative-feedback-controlled via a resistance voltage divider 70 and a comparator 69. The comparator 69 compares a reference voltage of a reference voltage generating circuit (GVRF) 67 as a reference voltage with a divided voltage that is output from the resistance voltage divider 70. When the divided voltage is lower than the reference voltage, the voltage decreasing operation is stopped. When the divided voltage is higher than the reference voltage, the voltage decreasing operation is started. With respect to the erase verify determination memory gate voltage used in the erasing operation, a voltage Vev1 used in the program area PGM is lower than a voltage Vev2 used in the data area DAT. Consequently, the resistance voltage divider 70 selects a voltage division node which varies between erasure in the program area PGM and erasure in the data area DAT. For erasure in the program area PGM, a voltage division node Np is selected by a PGM selection signal. For erasure in the data area DAT, a voltage division node Nd is selected by a DAT selection signal. FIG. 13 shows an example of generating the erase verify determination memory gate voltage by using the same circuit for the flash memories 11 and 12. The PGM selection signal and the DAT selection signal may be output, for example, from the CPU or a not-shown memory controller in accordance with a flash memory to be rewritten. Alternately, the erase verify determination memory gate voltage may be also generated by using different circuits for the flash memories 11 and 12. In this case, it is sufficient to fixedly select the PGM selection signal in a circuit for the program area PGM and to fixedly select the DAT selection signal in the circuit for the data area DAT.

Difference in Erase Verify Determination Memory Current Conditions

Figures 14, 15:
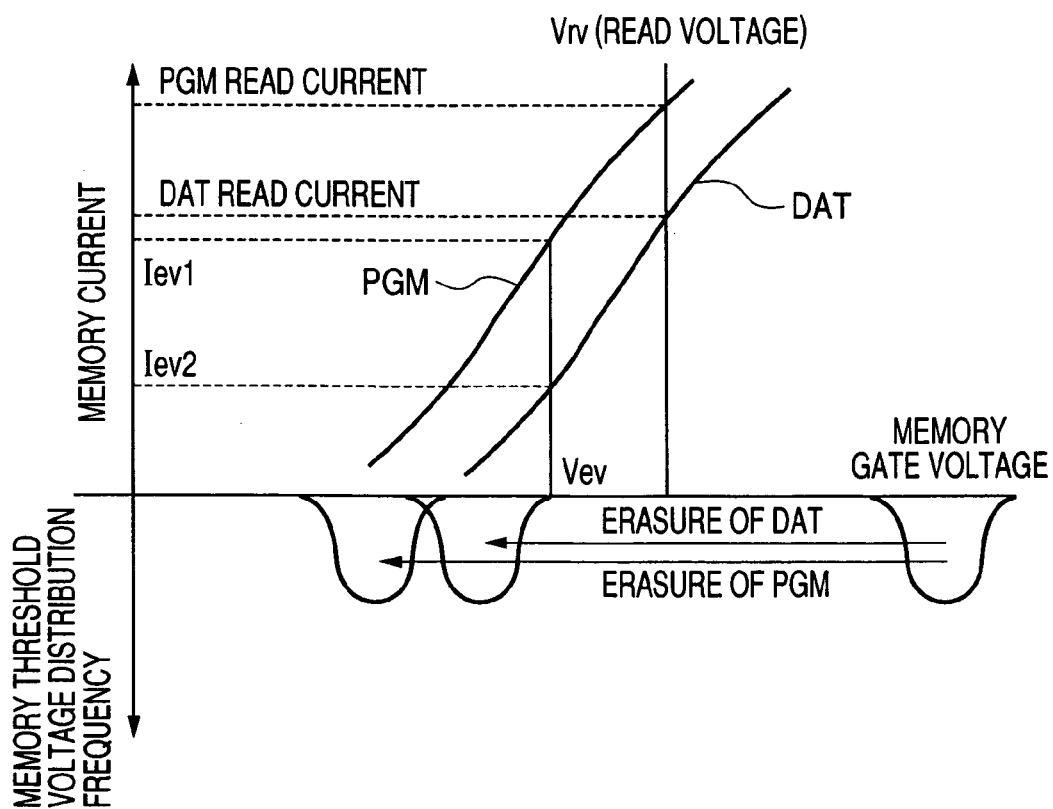
FIG. 14 is a diagram showing performances when erase verify determination memory current conditions in the program area PGM and those in the data area DAT are different from each other.
FIG. 15 is a characteristic diagram illustrating the relation between a threshold voltage amount and memory current when the erase verify determination memory current in the program area PGM is set to be larger than the erase verify determination memory current in the data area DAT.

As a second example of optimization of the rewrite condition, the case of making the erase verify determination memory current condition vary will be described. In the erase verification process S3, verification is performed by using erase verify determination memory current larger than that in the data area DAT for the program area PGM. It is sufficient to vary the erase verify determination memory current in accordance with the target to be erased which is either the flash memory 11 or 12. As shown in FIG. 14, when the erase verify determination memory current in the program area PGM is set as Iev1 and that in the data area DAT is set as Iev2, the relation of Iev1<Iev2 is satisfied. FIG. 15 shows the relation between the threshold voltage amount and the memory current at that time. When the read voltage Vrv is applied to the memory gate of the nonvolatile memory cell 20, read current flowing in the memory cell in the erase state in the program area PGM is larger than that in the data area DAT. In FIG. 14, when the reading speed in the program area PGM is S1 and that in the data area DAT is S2, the relation of S1>S2 is satisfied. An erase verify determination memory gate voltage Ve in the program area PGM and that in the data area DAT are the same.

Figure 16:
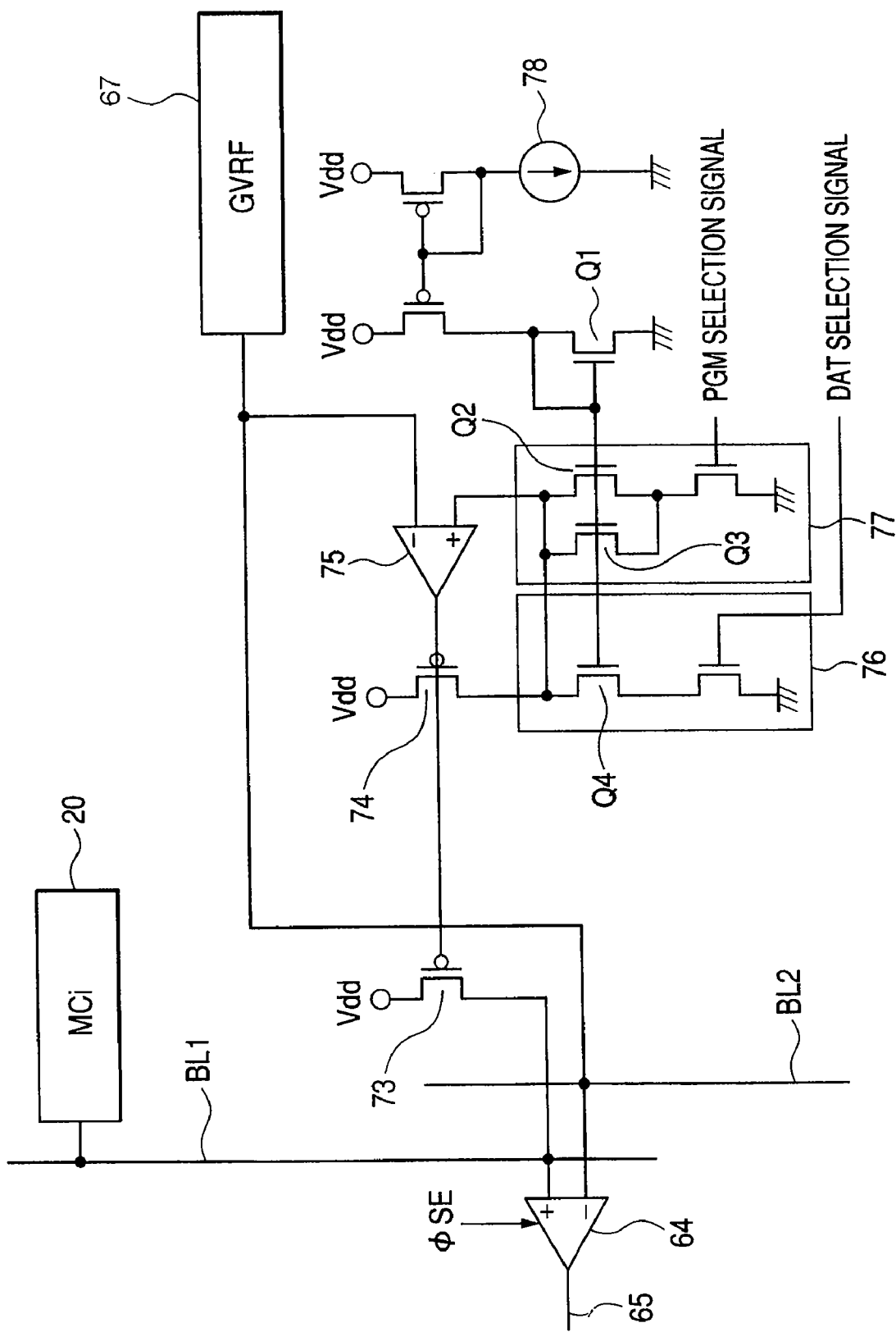
FIG. 16 is a circuit diagram of an erase verify memory current determination circuit.

FIG. 16 shows an example of the erase verification memory current determination circuit. The diagram illustrates a circuit configuration in the case where the bit line BL1 side is set as the sense side. Reference numeral 76 denotes a current generation circuit specifying the erase verify determination memory current Iev2 in the data area DAT. Reference numeral 77 denotes a current generation circuit specifying the erase verify determination memory current Iev1 in the program area PGM. Constant current flowing in a constant current source 78 is passed to a MOS transistor Q1 by a current mirror circuit, and the gate voltage of the MOS transistor Q1 is received by MOS transistors Q2, Q3, and Q4 of the current generation circuits 77 and 76. With the configuration, when the current generation circuit 77 is activated by the PGM selection signal, for example, current twice as large as that in the constant current source 78 is passed to a MOS transistor 74. When the current generation circuit 76 is activated by the DAT selection signal, for example, the same current as that in the constant current source 78 is passed to the MOS transistor 74. The same current as that in the MOS transistor 74 can be passed to a MOS transistor 73 because the gate terminals of the MOS transistors 73 and 74 are connected to the output of a comparator 75. Therefore, in the verifying operation, the maximum current flowing in the memory cell to be verified in the program area PGM and that in the data area DAT can be made different from each other. In the case of passing a relatively large memory current to the memory cell to be verified, the voltage on the bit line BL1 drops below the reference power source voltage. In the opposite case, the voltage on the bit line BL1 becomes higher than the reference power source voltage. Based on the difference, the memory threshold voltage can be determined. Depending on whether a flash memory to which the memory cell to be verified belongs is in the program area PGM or the data area DAT, the difference can be set for the memory current be passed to the memory cell to be verified. When the current flowing in the MOS transistor 74 is large, accordingly, large current has to be passed to a memory cell transistor to be subjected to erase verification. In other words, a memory cell to be subjected to erase verification has to have high conductance. In short, a low threshold voltage is set for the memory cell. Although the circuit for generating the erase verify determination memory current does not have to be shared by the program area PGM and the data area DAT, if it is shared, the power source circuit is commonly used, and the chip area can be reduced.

By also making the erase verify determination memory current condition vary as described above, like the case of making the erase verify determination memory gate voltage condition vary, large read current is obtained in the program area PGM in the flash memory 11. Consequently, reading speed increases. In the data area DAT in the flash memory 12, since a memory threshold voltage change is small, the assured number of rewriting times can be increased.

Difference in Write Verify Determination Memory Gate Voltage Conditions

Figures 17, 18:
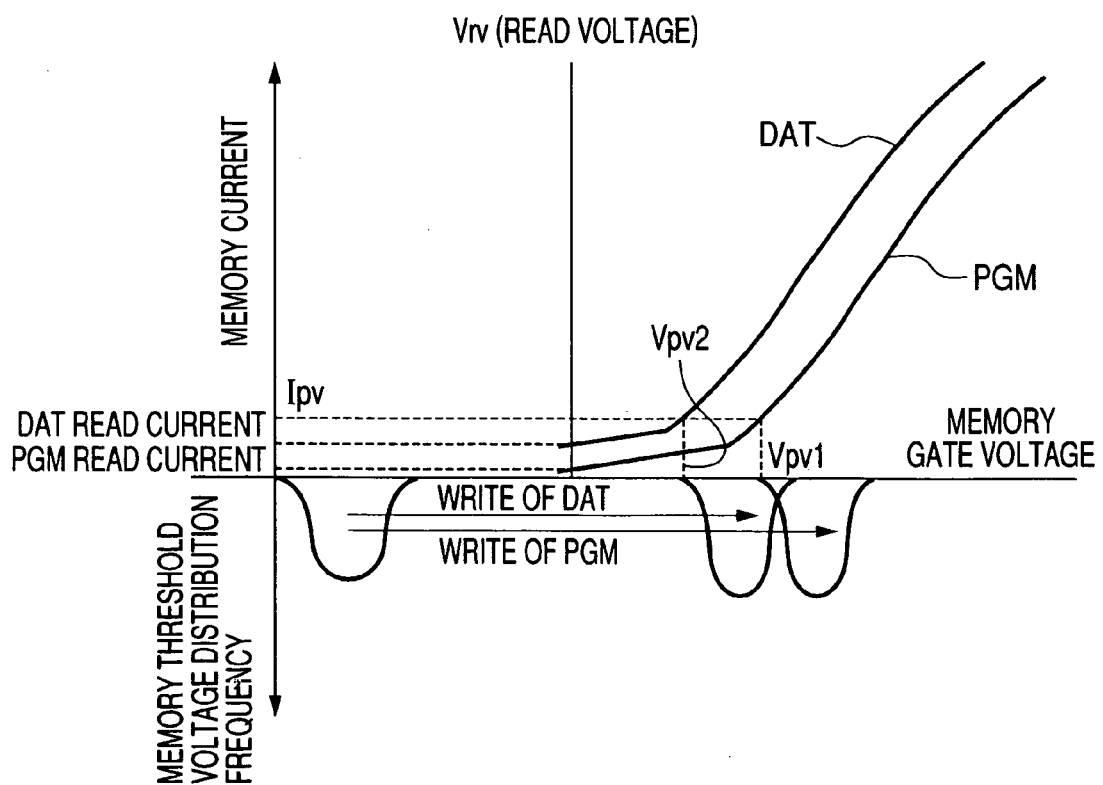
FIG. 17 is a diagram showing performances when write verify determination memory current conditions in the program area PGM and those in the data area DAT are different from each other.
FIG. 18 is a characteristic diagram illustrating the relation between a threshold voltage amount and memory current when the write verify determination memory gate voltage in the program area PGM is set to be higher than the write verify determination memory gate voltage in the data area DAT by Vpv2.
Figure 19:
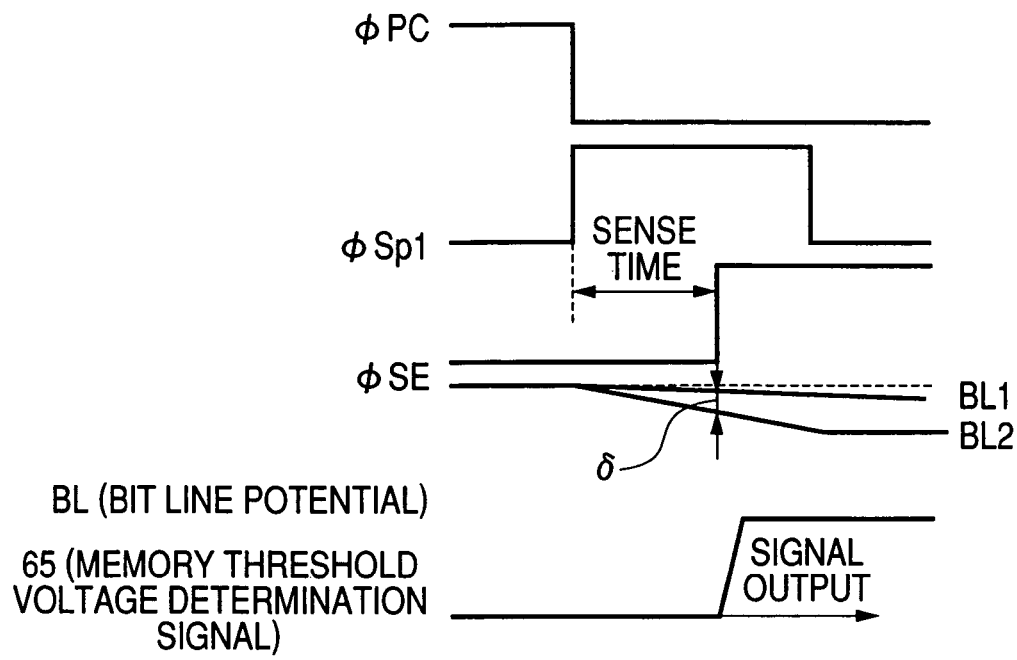
FIG. 19 is a waveform chart illustrating the waveforms of read signals to a memory cell in the write state in the program area PGM.
Figure 20:
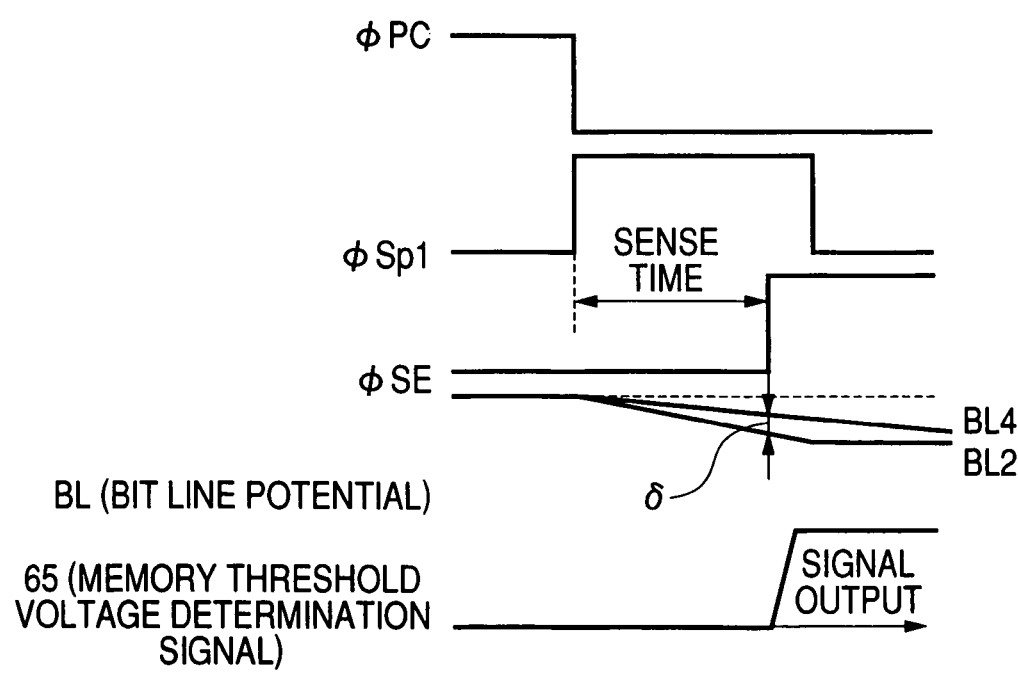
FIG. 20 is a waveform chart illustrating the waveforms of read signals to a memory cell in the write state in the data area DAT.

As a third example of optimization of the rewrite condition, the case of making the write verify determination memory gate voltage condition vary will be described. In the write verification process S14, a write verify determination memory gate voltage higher than that in the data area DAT is applied to the program area PGM. It is sufficient to vary the write verify determination memory gate voltage in accordance with the target to be written which is either the flash memory 11 or 12. As shown in FIG. 17, when the write verify determination memory gate voltage in the program area PGM is set as Vpv1 and that in the data area DAT is set as Vpv2, the relation of Vpv1>Vpv2 is satisfied. FIG. 18 shows the relation between the threshold voltage amount and the memory current at that time. When the read voltage Vrv is applied to the memory gate of the nonvolatile memory cell 20, read current (in this case, off-state current) for a memory cell in the write state in the program area PGM is suppressed as compared with that in the data area DAT. FIG. 19 shows read signal waveforms for the memory cell in the write state in the program area PGM. FIG. 20 shows read signal waveforms for the memory cell in the write state in the data area DAT. Since the threshold voltage in the memory cell 20 in the write state in the program area PGM is set to be higher than that in the data area DAT, the sense time Tsp in the program area PGM is shorter than that in the data area DAT. Therefore, data reading speed can be increased more in the program area PGM than that in the data area DAT. When the reading speed in the program area PGM is S1 and the reading speed in the data area DAT is S2, the relation of S1>S2 is satisfied. Since a memory threshold voltage change is small in the data area DAT in the flash memory 12, the assured number of rewriting times can be increased.

Difference in Write Verify Determination Memory Current Conditions

Figures 21, 22:
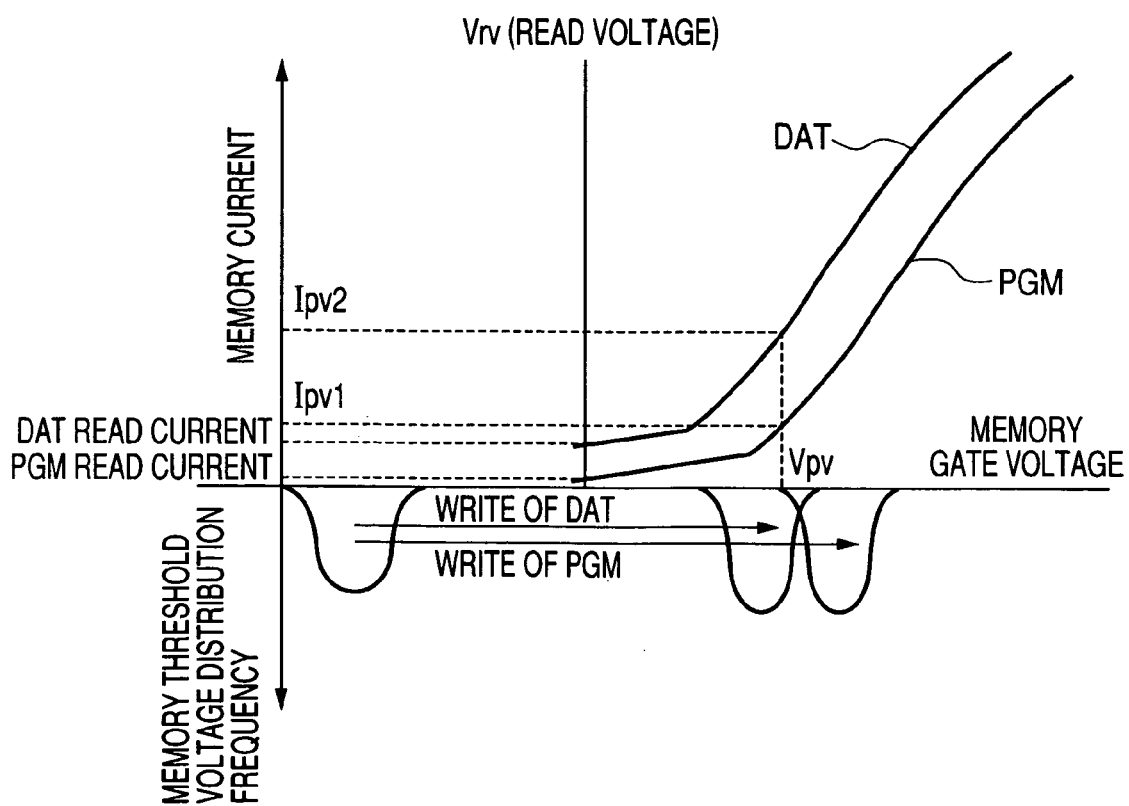
FIG. 21 is a diagram showing performances when write verify determination memory current conditions in the program area PGM and those in the data area DAT are different from each other.
FIG. 22 is a characteristic diagram illustrating the relation between a threshold voltage amount and memory current when the write verify determination memory current in the program area PGM is set to be higher than the write verify determination memory current in the data area DAT.

As a fourth example of optimization of the rewrite condition, the case of making the write verify determination memory current condition vary will be described. In the write verification process S14, verification is performed by using write verification determining memory current smaller than that in the data area DAT on the program area PGM. It is sufficient to vary the write verify determination memory current in accordance with the target to be written which is either the flash memory 11 or 12. As shown in FIG. 21, when the write verify determination memory current in the program area PGM is set as Ipv1 and that in the data area DAT is set as Ipv2, the relation of Ipv1<Ipv2 is satisfied. FIG. 22 shows the relation between the threshold voltage amount and the memory current at that time. When the read voltage Vrv is applied to the memory gate of the nonvolatile memory cell 20, read current (in this case, off-state current) for a memory cell in the write state in the program area PGM is suppressed as compared with that in the data area DAT. Since the threshold voltage in the memory cell 20 in the write state in the program area PGM is set to be higher than that in the data area DAT, the sense time Tsp in the program area PGM is shorter than that in the data area DAT. Therefore, data reading speed can be increased more in the program area PGM than that in the data area DAT. When the read speed in the program area PGM is S1 and the read speed in the data area DAT is S2 in FIG. 21, the relation of S1>S2 is satisfied. Since a memory threshold voltage change is small in the data area DAT in the flash memory 12, the assured number of rewriting times can be increased. The same write verify determination memory gate voltage Vpv is used for both of the areas.

A write verify determination memory current determining circuit can be constructed by a constant current circuit for simultaneously generating plural different constant currents in a manner similar to FIG. 16. According to a flash memory to which a memory cell to be verified belongs, the constant current circuit is switched.

As described above, also by making the write verify determination memory current condition vary, in a manner similar to the case of making the write verify determination memory gate voltage condition vary, large read current is obtained in the program area PGM in the flash memory 11, so that reading speed increases. Since a memory threshold voltage change is small in the data area DAT in the flash memory 12, the assured number of rewriting times can be increased.

Figures 23, 24:
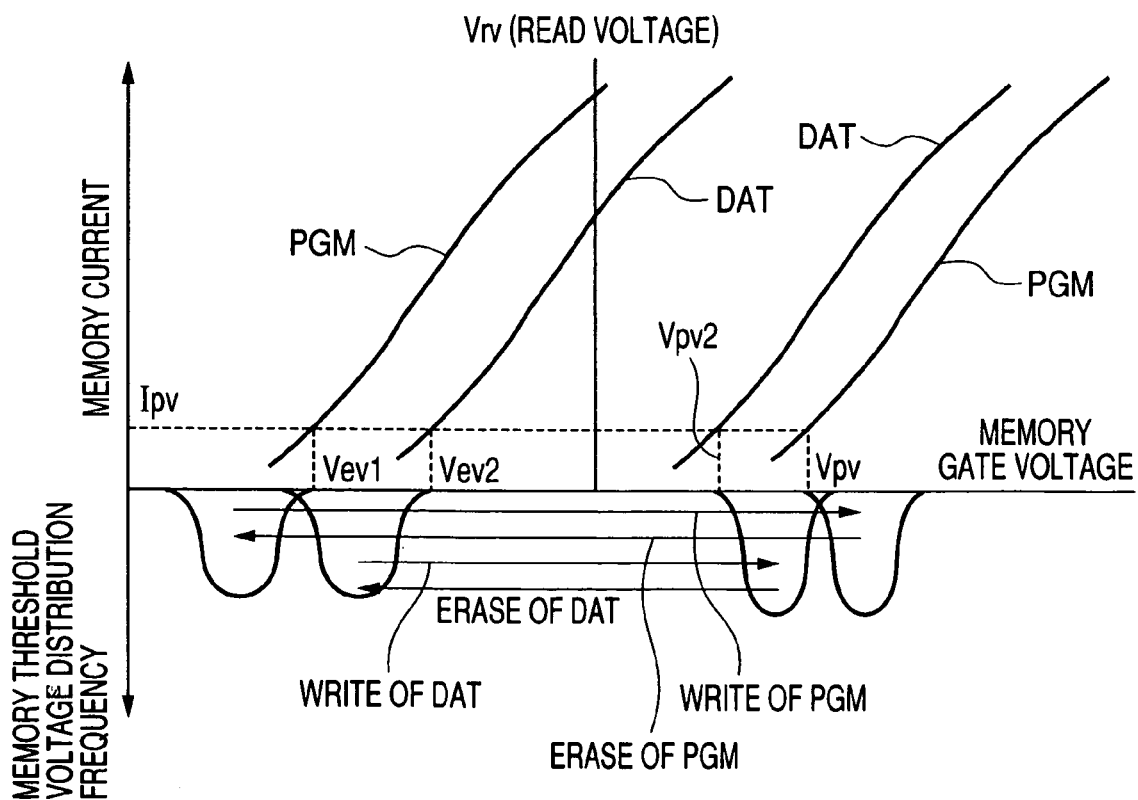
FIG. 23 is a diagram showing performances when erase and write verify determination memory gate voltage conditions in the program area PGM and those in the data area DAT are different from each other.
FIG. 24 is a characteristic diagram illustrating the relation between a threshold voltage amount and memory current when the erase verify determination memory gate voltage in the program area PGM is set to be lower than that in the data area DAT, and the write verify determination memory gate voltage in the program area PGM is set to be higher than that in the data area DAT.

Difference in Erase and Write Verify Determination Memory Gate Voltage Conditions As a fifth example of optimization of the rewrite condition, the case of making both of the erase verify determination memory gate voltage condition and the write verify determination memory gate voltage condition vary will be described. In the erase verification process S3, an erase verify determination memory gate voltage lower than that in the data area DAT is applied to the program area PGM. It is sufficient to change the erase verify determination memory gate voltage in accordance with a target to be erased which is either the flash memory 11 or 12. Further, in the write verification process S14, a write verify determination memory gate voltage higher than that in the data area DAT is applied to the program area PGM. It is sufficient to vary the write verify determination memory gate voltage in accordance with the target to be written which is either the flash memory 11 or 12. As shown in FIG. 23, the relation of Vev1<Vev2 and the relation of Vpv1>Vpv2 are satisfied. FIG. 24 shows the relation between the threshold voltage amount and the memory current at that time. When the read voltage Vrv is applied to the memory gate of the nonvolatile memory cell 20, read current flowing in the memory cell in the erase state in the program area PGM becomes larger than that in the data area DAT. When the read voltage Vrv is applied to the memory gate in the nonvolatile memory cell 20, read current (off current in this case) to the memory cell in the write state in the program area PGM is suppressed as compared with that in the data area DAT. Effects of both of the first and second examples of the optimization of the rewrite condition can be obtained.

Although not shown, it is also possible to apply both of the difference in the erase verify determination memory current conditions in the third example and the difference in the write verify determination memory current conditions in the fourth example. Alternately, a combination of the first and third examples and a combination of the second and fourth examples are also possible.

Difference in Erase Voltage Condition

Figures 25, 26:
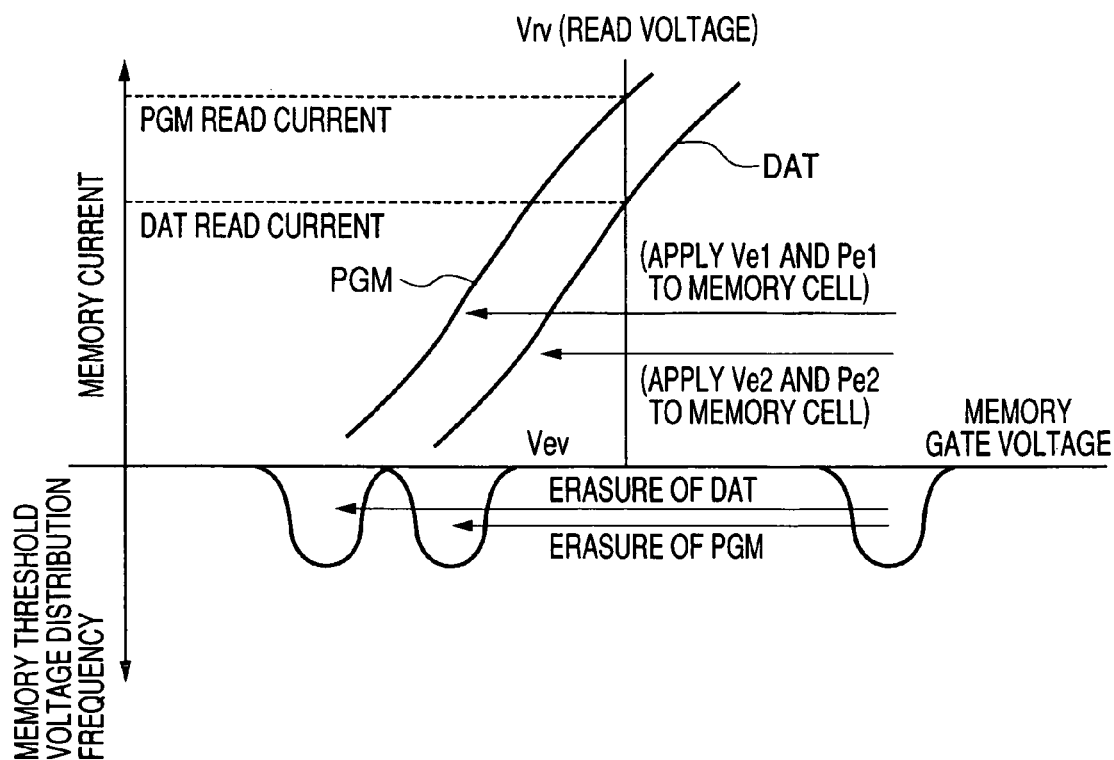
FIG. 25 is a diagram showing performances when the erase voltage condition in the program area PGM and that in the data area DAT are different from each other.
FIG. 26 is a characteristic diagram illustrating the relation between a threshold voltage amount and memory current when the erase voltage in the program area PGM is set to be higher than that in the data area DAT, and erase voltage application time in the program area PGM is set to be longer than that in the data area DAT.

As a sixth example of optimization of the rewrite condition, the case of making the erase voltage condition vary will be described. In the erase voltage applying process S2, an erase voltage whose absolute value is higher than that in the data area DAT is applied to the program area PGM. It is sufficient to change the erase voltage in accordance with a target to be erased which is either the flash memory 11 or 12. Alternately, the erase voltage application time for the program area PGM is set to be longer than that for the data area DAT in the erase voltage applying process S2. Both of the erase voltage and the erase voltage application time may be made vary. As illustrated in FIG. 25, when the erase voltage in the program area PGM is set as Ve1 and the erase voltage in the data area DAT is set as Ve2, |Ve1|>|Ve2| is satisfied. When erase voltage application time in the program area PGM is set as Pe1 and that in the data area DAT is set as Pe2, the relation of Pe1>Pe2 is satisfied. FIG. 26 shows the relation between the threshold voltage amount and the memory current at that time. In the program area PGM, the memory threshold voltage can be lowered, and the read current in the program area can be made larger than that in the data area DAT. In the data area DAT, the memory threshold voltage does not decrease excessively and a memory threshold voltage distribution after application of the voltage is narrowed, so that a memory threshold voltage change can be suppressed. Consequently, the assured number of rewriting times can be increased.

Figure 27:
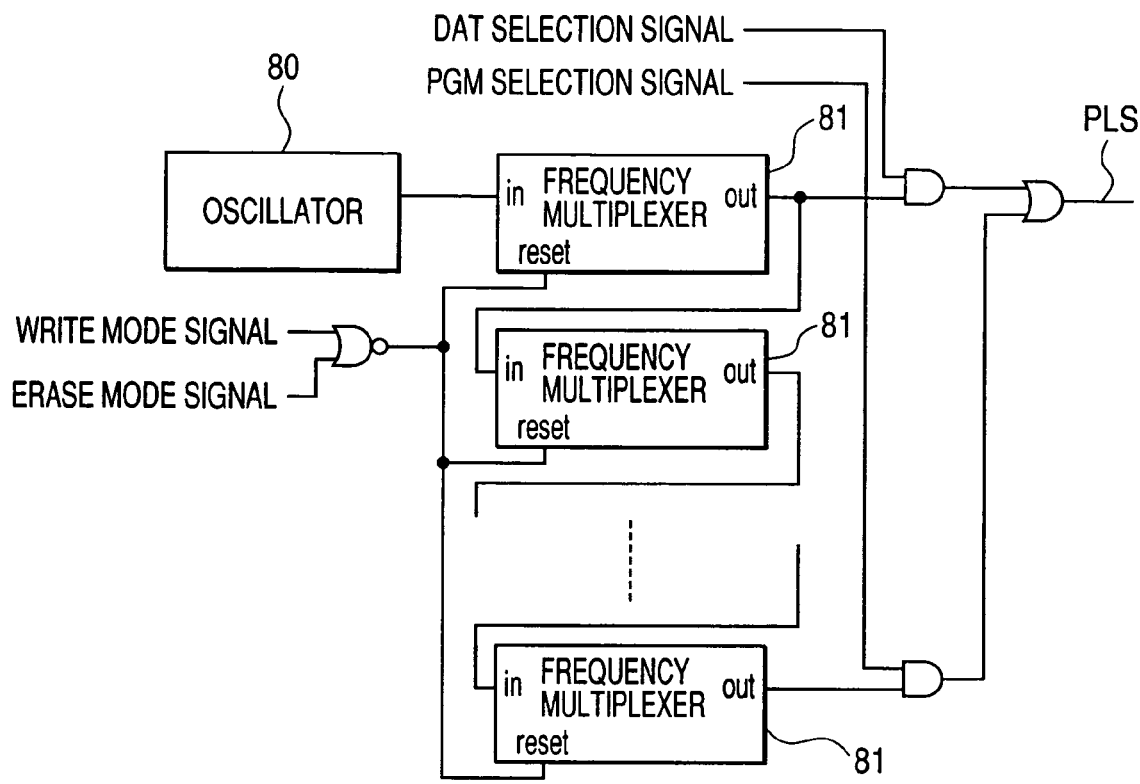
FIG. 27 is a circuit diagram showing an erase voltage application pulse generating circuit.
Figure 28:
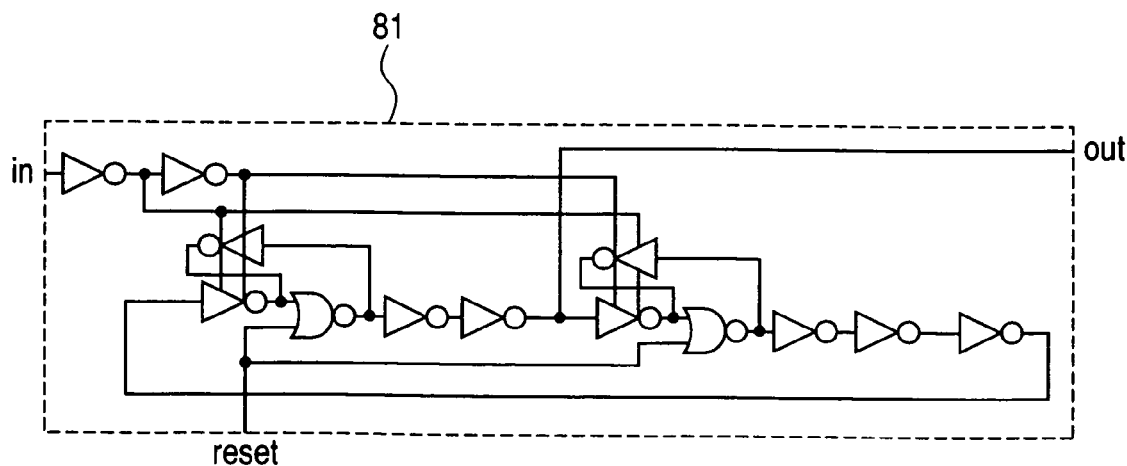
FIG. 28 is a circuit diagram showing a configuration of a frequency multiplier.

FIG. 27 shows an erase voltage application pulse generating circuit. A clock signal output from an oscillator 80 is transmitted to frequency multipliers 81 in plural stages connected in series. To erase the data area DAT, an output of the frequency multiplier 81 in the first stage is selected by a DAT selection signal and is used as an erase voltage application pulse PLS. To erase the program area PGM, an output of the frequency multiplier 81 in the final stage is selected by a PGM selection signal and is used as the erase voltage application pulse PLS. FIG. 28 illustrates a circuit configuration of the frequency multiplier 81.

Difference in Write Voltage Conditions

Figures 29, 30:
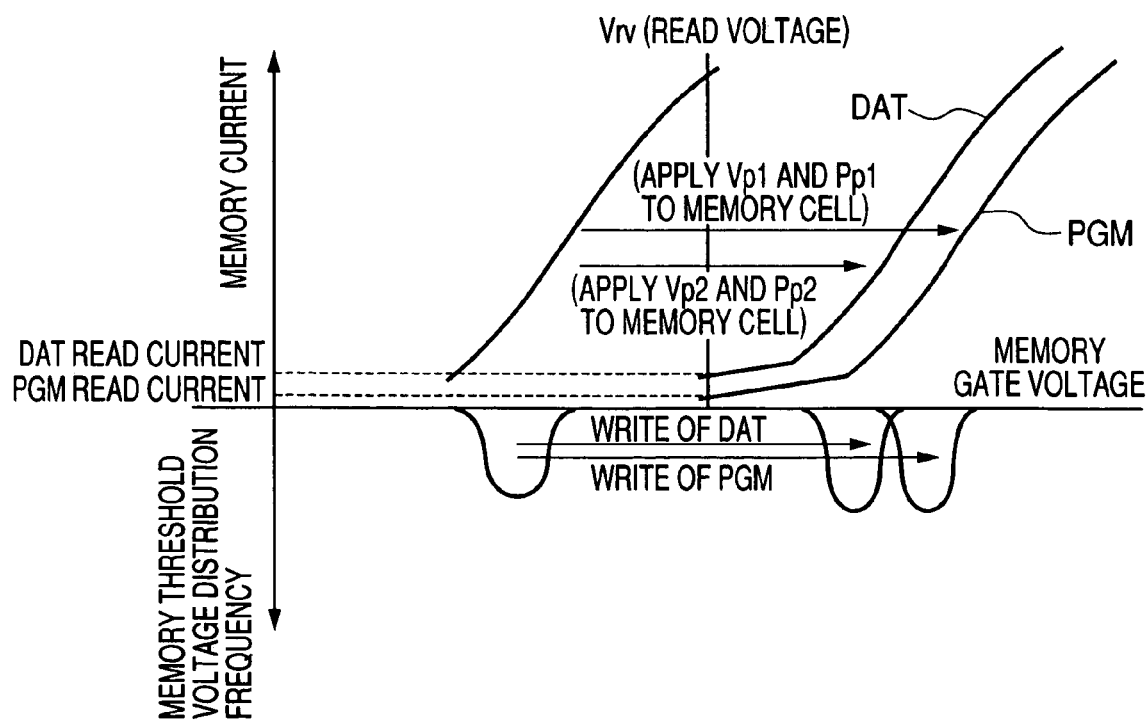
FIG. 29 is a diagram showing performances when the write voltage condition in the program area PGM and that in the data area DAT are different from each other.
FIG. 30 is a characteristic diagram illustrating the relation between a threshold voltage amount and memory current when the write voltage in the program area PGM is set to be higher than that in the data area DAT, and write voltage application time in the program area PGM is set to be longer than that in the data area DAT.

As a seventh example of optimization of the rewrite condition, the case of making the write voltage condition vary will be described. In the write voltage applying process S13, a write voltage whose absolute value is higher than that in the data area DAT is applied to the program area PGM. It is sufficient to change the write voltage in accordance with a target to be written which is either the flash memory 11 or 12. Alternately, the write voltage application time for the program area PGM is set to be longer than that for the data area DAT in the write voltage applying process S13. Both of the write voltage and the write voltage application time may be made vary. As illustrated in FIG. 29, when the write voltage in the program area PGM is set as Vp1 and the write voltage in the data area DAT is set as Vp2, |Vp1|>|Vp2| is satisfied. When write voltage application time in the program area PGM is set as Pp1 and that in the data area DAT is set as Pp2, the relation of Pp1>Pp2 is satisfied. FIG. 30 shows the relation between the threshold voltage amount and the memory current at that time. In the writing process, the memory threshold voltage in the program area PGM can be increased and the read current for a memory cell in a write state can be suppressed to be small. Thus, reading speed for a memory cell in the erase state can be made high relatively. In the data area DAT, the memory threshold voltage does not increase excessively and a memory threshold voltage distribution after application of the voltage is narrowed, so that a memory threshold voltage change can be suppressed to be relatively small. Consequently, the assured number of rewriting times can be increased. It is sufficient to employ circuits similar to FIGS. 27 and 28 to generate a write voltage application pulse.

Difference in Nonvolatile Memory Cell Structures

Optimization of the memory cell characteristic for the difference in the uses for the data area and the program area is carried out not only by the difference in the rewriting conditions but also by the difference in the device structure conditions of a memory cell. Specifically, the memory cell gate length and/or the memory cell gate width in the program area PGM are/is different from those/that in the data area DAT. The program area PGM is superior to the data area DAT with respect to the reading speed performance, and the data area DAT is superior to the program area PGM with respect to the assured number of rewriting times. Concretely, the memory cell gate length in the program area PGM is set to be shorter than that in the data area DAT. The memory cell gate width in the program area PGM is set to be larger than that in the data area DAT. The shorter the memory cell gate length is or the larger the memory gate width is, the larger the conductance of the memory cell transistor is, and it contributes to increase in the reading speed. Not only the difference in the erase/write conditions but also the difference in the structures of the gate length of the nonvolatile memory cell and the like can be also employed. FIG. 31 illustrates the superiority/inferiority of the characteristics according to the difference in the memory cell gate lengths and the memory cell gate widths.

FIG. 32 shows the summary of the difference in the rewriting conditions and the difference in the device structural conditions of the memory cell with respect to the uses of the data area DAT and the program area PGM. By selectively employing one or plural conditions from the listed conditions, the rewriting condition or the like can be optimized so that memory current is sufficiently obtained in the program area PGM and the voltage stress in the data area DAT is lessened. Thus, both of increase in the reading speed and increase in the assured number of rewriting times can be realized on the same chip.

Although the invention has been described with respect to the microcomputer as an example, the invention can be also regarded as a data processing method of rewriting stored information in the data area DAT and the program area PGM in a data processing system such as a microcomputer. As the method at this time, the method described in the optimization of the rewriting conditions is used. The control is performed mainly by the CPU 2. Alternately, a rewrite command may be received from an external writer such as an EPROM writer and executed by the CPU 2.

Although the invention achieved by the inventors has been described concretely on the basis of the embodiment, obviously, the invention is not limited to the embodiment but may be variously modified without departing from the gist.

For example, the program area and the data area may not be separate flash memory modules. A flash memory can be also constructed by using a memory array as part of one flash memory module as a program area and using another memory array as a data area. The bus configuration of the microcomputer is not limited to the 2-bus configuration but may be a 3-bus configuration or a 1-bus configuration. Obviously, circuit modules other than the above may be also formed on the chip of the data processor. The electrically rewritable nonvolatile memory is not limited to a flash memory but may be an EEPROM or the like. The invention can be widely applied to a semiconductor integrated circuit such as a microcomputer or a system LSI on which a rewritable nonvolatile memory such as a flash memory is provided on the chip, a multi-chip module on which such a semiconductor integrated circuit and another semiconductor integrated circuit are mounted on a package board, or the like.

What is claimed is:

1. A semiconductor integrated circuit comprising:
a central processing unit; and
a rewritable nonvolatile memory area provided in an address space in the central processing unit,
wherein the rewritable nonvolatile memory area includes a first nonvolatile memory area and a second nonvolatile memory area, each of which stores information in accordance with a difference in threshold voltages,
at least one condition out of the following conditions is made different between the first nonvolatile memory area and the second nonvolatile area: erase verify voltage, erase verify current, write verify voltage, write verify current, erase voltage, erase voltage application time, write voltage, and write voltage application time,
a speed of reading information stored in the first nonvolatile memory area is faster than a speed of reading information stored in the second nonvolatile memory area, and
an assured number of rewriting times in the second nonvolatile memory area is greater than an assured number of rewriting times in the first nonvolatile memory area.

2. The semiconductor integrated circuit according to claim 1,
wherein when an erase verify voltage in the first nonvolatile memory area is different from an erase verify voltage in the second nonvolatile memory area, the erase verify voltage in the first nonvolatile memory area is set lower than the erase verify voltage in the second nonvolatile memory area.

3. The semiconductor integrated circuit according to claim 1,
wherein when an erase verify current in the first nonvolatile memory area is different from an erase verify current in the second nonvolatile memory area, the erase verify current in the first nonvolatile memory area is set larger than the erase verify current that in the second nonvolatile memory area.

4. The semiconductor integrated circuit according to claim 1,
wherein when a write verify voltage in the first nonvolatile memory area is different from a write verify voltage in the second nonvolatile memory area, the write verify voltage in the first nonvolatile memory area is set higher than the write verify voltage in the second nonvolatile memory area.

5. The semiconductor integrated circuit according to claim 1,
wherein when a write verify current in the first nonvolatile memory area is different from the write verify current in the second nonvolatile memory area, the write verify current in the first nonvolatile memory area is set smaller than the write verify current in the second nonvolatile memory area.

6. The semiconductor integrated circuit according to claim 1,
wherein when a write verify voltage and an erase verify current in the first nonvolatile memory area are different from a write verify voltage and an erase verify current in the second nonvolatile memory area, the write verify current in the first nonvolatile memory area is set higher than the write verify voltage in the second nonvolatile memory area, and the erase verify voltage in the first nonvolatile memory area is set lower than the erase verify voltage in the second nonvolatile memory area.

7. The semiconductor integrated circuit according to claim 1,
wherein when an erase voltage in the first nonvolatile memory area is different from an erase voltage in the second nonvolatile memory area, the erase voltage in the first nonvolatile memory area is set higher than the erase voltage in the second nonvolatile memory area.

8. The semiconductor integrated circuit according to claim 1,
wherein when an erase voltage application time in the first nonvolatile memory area is different from an erase voltage application time in the second nonvolatile memory area, the erase voltage application time in the first nonvolatile memory area is set longer than the erase voltage application time in the second nonvolatile memory area.

9. The semiconductor integrated circuit according to claim 1,
wherein when a write voltage in the first nonvolatile memory area is different from a write voltage in the second nonvolatile memory area, the write voltage in the first nonvolatile memory area is set higher than the write voltage in the second nonvolatile memory area.

10. The semiconductor integrated circuit according to claim 1,
wherein when a write voltage application time in the first nonvolatile memory area is different from a write voltage application time in the second nonvolatile memory area, the write voltage application time in the first nonvolatile memory area is set longer than the write voltage application time in the second nonvolatile memory area.

11. The semiconductor integrated circuit according to claim 1,
wherein a memory cell gate length and/or a memory cell gate width in the first nonvolatile memory area are/is different from a memory cell gate length and/or a memory cell gate width in the second nonvolatile memory area.

12. The semiconductor integrated circuit according to claim 11,
wherein when a memory cell gate length in the first nonvolatile memory area is different from a memory cell gate length in the second nonvolatile memory area, the memory cell gate length in the first nonvolatile memory area is set shorter than the memory cell gate length in the second nonvolatile memory area.

13. The semiconductor integrated circuit according to claim 12,
wherein when a memory cell gate width in the first nonvolatile memory area is different from a memory cell gate width in the second nonvolatile memory area, the memory cell gate width in the first nonvolatile memory area is set larger than the memory cell gate width in the second nonvolatile memory area.

14. The semiconductor integrated circuit according to claim 1,
wherein the first nonvolatile memory area and the second nonvolatile memory area are separately provided.

15. The semiconductor integrated circuit according to claim 1,
wherein the first and second nonvolatile memory areas are provided as a single nonvolatile memory.

16. The semiconductor integrated circuit according to claim 1,
wherein the first nonvolatile memory area is used to store a program, and the second nonvolatile memory area is used to store data.

17. A semiconductor integrated circuit comprising:
a central processing unit; and
a rewritable nonvolatile memory area provided in an address space in the central processing unit,
wherein the rewriteable nonvolatile memory area includes a first nonvolatile memory area and a second nonvolatile memory area, each of which stores information in accordance with a difference in threshold voltages,
a memory cell gate length and/or memory cell gate width in the first nonvolatile memory area are/is different from a memory cell gate length and/or memory cell gate width in the second nonvolatile memory area,
a speed of reading information stored in the first nonvolatile memory area is faster than a speed of reading information stored in the second nonvolatile memory area, and
an assured number of rewriting times in the second nonvolatile memory area is greater than an assured number of rewriting times in the first nonvolatile memory area.

18. The semiconductor integrated circuit according to claim 17,
wherein when the memory cell gate length in the first nonvolatile memory area is different from the memory cell gate length in the second nonvolatile memory area, the memory cell gate length in the first nonvolatile memory area is set shorter than the memory cell gate length in the second nonvolatile memory area.

19. The semiconductor integrated circuit according to claim 17,
wherein when the memory cell gate width in the first nonvolatile memory area is different from the memory cell gate width in the second nonvolatile memory area, the memory cell gate width in the first nonvolatile memory area is set to be larger than the memory cell gate width in the second nonvolatile memory area.

20. A data processing method of rewriting a first nonvolatile memory area and a second nonvolatile memory area, each of which stores information in accordance with a difference in threshold voltages, in a data processing system comprising the first and second nonvolatile memory areas and a central processing unit accesses the first and second memory areas, the method comprising the steps of:
making at least one condition different between the first nonvolatile memory area and the second nonvolatile memory area out of the following conditions: erase verify voltage, erase verify current, write verify voltage, write verify current, erase voltage, erase voltage application time, write voltage, and write voltage application time;
setting a speed of reading information stored in the first nonvolatile memory area faster than a speed of reading information stored in the second nonvolatile memory area; and
setting an assured number of rewriting times in the second nonvolatile memory area greater than an assured number of rewriting times in the first nonvolatile memory area.

* * * * *